(12) United States Patent
Whitefield

(10) Patent No.: US 10,847,543 B2
(45) Date of Patent: *Nov. 24, 2020

(54) TRANSISTOR FINGER SPACING AND DIMENSION VARIATION IN ELECTRONIC DEVICES

(71) Applicant: SKYWORKS SOLUTIONS, INC., Woburn, MA (US)

(72) Inventor: David Scott Whitefield, Andover, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/270,946

(22) Filed: Feb. 8, 2019

(65) Prior Publication Data

US 2019/0172842 A1 Jun. 6, 2019

Related U.S. Application Data

(63) Continuation of application No. 15/714,221, filed on Sep. 25, 2017, now Pat. No. 10,229,932, which is a continuation of application No. 15/240,771, filed on Aug. 18, 2016, now Pat. No. 9,806,094.

(60) Provisional application No. 62/208,540, filed on Aug. 21, 2015.

(51) Int. Cl.
*H01L 27/12* (2006.01)
*H01L 27/088* (2006.01)
*H01L 29/417* (2006.01)
*H01L 27/02* (2006.01)

(52) U.S. Cl.
CPC ...... *H01L 27/1203* (2013.01); *H01L 27/0207* (2013.01); *H01L 27/088* (2013.01); *H01L 29/41725* (2013.01); *H01L 29/41733* (2013.01)

(58) Field of Classification Search
CPC ............. H01L 27/1203; H01L 27/0207; H01L 27/088; H01L 29/41725
See application file for complete search history.

(56) References Cited

U.S. PATENT DOCUMENTS

| 2006/0160520 A1* | 7/2006 | Miyazawa | H01P 1/15 455/333 |
| 2016/0294369 A1* | 10/2016 | Bao | G05F 3/205 |
| 2016/0343813 A1* | 11/2016 | Hurwitz | H01L 23/5226 |

* cited by examiner

*Primary Examiner* — Christine A Enad
(74) *Attorney, Agent, or Firm* — Chang & Hale LLP

(57) ABSTRACT

A radio-frequency device comprises a first transistor including a first set of fingers having a first finger-to-finger spacing in a width dimension of the first transistor, and a second transistor in a series connection with the first transistor, the second transistor including a second set of fingers having a second finger-to-finger spacing in the width dimension that is greater than the first finger-to-finger spacing.

21 Claims, 25 Drawing Sheets

TRANSISTOR FINGER SPACING AND DIMENSION VARIATION IN ELECTRONIC DEVICES

CROSS-REFERENCE TO RELATED APPLICATION(S)

This application is a continuation of U.S. patent application Ser. No. 15/714,221, filed Sep. 25, 2017, and entitled VOLTAGE DISTRIBUTION IN TRANSISTOR STACKS USING NON-UNIFORM TRANSISTOR DIMENSIONS, which is a continuation of U.S. patent application Ser. No. 15/240,771, filed Aug. 18, 2016, and entitled NON-UNIFORM SPACING IN TRANSISTOR STACKS, which claims priority to U.S. Provisional Application No. 62/208,540, filed Aug. 21, 2015, and entitled NON-UNIFORM SPACING IN TRANSISTOR STACKS, the disclosures of which are hereby incorporated by reference in its entirety.

BACKGROUND

Field

The present disclosure generally relates to the field of electronics, and more particularly, to radio-frequency (RF) modules and devices.

Description of Related Art

In electronics applications, passive and active devices can be utilized for various purposes, such as for routing and/or processing of radio-frequency (RF) signals in wireless devices.

SUMMARY

In some implementations, the present disclosure relates to a field-effect transistor stack comprising a first field-effect transistor having a source finger, a drain finger, and a gate finger interposed therebetween, the source finger and the drain finger of the first field-effect transistor being separated by a first drain-to-source distance, and a second field-effect transistor in a series connection with the first field-effect transistor, the second field-effect transistor having a source finger, a drain finger, and a gate finger interposed therebetween, the source finger and the drain finger of the second field-effect transistor being separated by a second drain-to-source distance that is different than the first drain-to-source distance.

In certain embodiments, the second drain-to-source distance is greater than the first drain-to-source distance. The field-effect transistor stack may further comprise a third field-effect transistor in a series connection with the second field-effect transistor, the third field-effect transistor having a source finger, a drain finger, and a gate finger interposed therebetween the source finger and the drain finger of the third field-effect transistor being separated by a third drain-to-source distance that is different than both the first and second drain-to-source distances.

In certain embodiments, the first and second field-effect transistors are silicon-on-insulator (SOI) transistors. The gate finger of the first field-effect transistor may have a gate width that is shorter than a gate width of the gate finger of the second field-effect transistor. In certain embodiments, the first field-effect transistor occupies a smaller physical area than the second field-effect transistor.

In some implementations, the present disclosure relates to a field-effect transistor stack comprising a first field-effect transistor having a first plurality of source fingers, a first plurality of corresponding drain fingers, and a first plurality of gate fingers including a gate finger disposed between each adjacent pair of source and drain fingers of the first plurality of drain fingers and the first plurality of source fingers, a respective source finger and its corresponding adjacent drain finger of the first field-effect transistor being separated by a first drain-to-source distance, and a second field-effect transistor in a series connection with the first field-effect transistor, the second field-effect transistor having a second plurality of source fingers, a second plurality of corresponding drain fingers, and a second plurality of gate fingers including a gate finger disposed between each adjacent pair of source and drain fingers of the second plurality of drain fingers and the second plurality of source fingers, a respective source finger and its corresponding adjacent drain finger of the second field-effect transistor being separated by a second drain-to-source distance that is different than the first drain-to-source distance. In certain embodiments, the second drain-to-source distance is greater than the first drain-to-source distance.

The field-effect transistor stack may further comprise a third field-effect transistor in a series connection with the second field-effect transistor, the third field-effect transistor having a third plurality of source fingers, a third plurality of corresponding drain fingers, and a third plurality of gate fingers including a gate finger disposed between each adjacent pair of source and drain fingers of the third plurality of drain fingers and the third plurality of source fingers, a respective source finger and its corresponding adjacent drain finger of the third field-effect transistor being separated by a third drain-to-source distance that is different than both the first and second drain-to-source distances. In certain embodiments, the second plurality of gate fingers has a gate width that is longer than a gate width of the first plurality of gate fingers and shorter than a gate width of the third plurality of gate fingers. The field-effect transistor stack may further comprise a fourth field-effect transistor in a series connection with the third field-effect transistor, the fourth field-effect transistor having a fourth plurality of source fingers, a fourth plurality of corresponding drain fingers, and a fourth plurality of gate fingers including a gate finger disposed between each adjacent pair of source and drain fingers of the fourth plurality of drain fingers and the fourth plurality of source fingers, a respective source finger and its corresponding adjacent drain finger of the fourth field-effect transistor being separated by a fourth drain-to-source distance that is equal to third distance.

In certain embodiments, the first plurality of gate fingers comprises more gate fingers than the second plurality of gate fingers. The first plurality of gate fingers may have a first gate width that is shorter than a gate width of the second plurality of gate fingers. The first field-effect transistor may have a total periphery that is greater than a total periphery of the second field-effect transistor. In certain embodiments, the first field-effect transistor has a first plurality of drain fingers having second level metal traces electrically coupled thereto to provide added capacitance. The first field-effect transistor may occupy a smaller physical area than the second field-effect transistor. The first field-effect transistor may have a physical area equal to a physical area of the second field-effect transistor.

In some implementations, the present disclosure relates to a transistor stack comprising a plurality of field-effect transistors connected in series, a first field-effect transistor of the plurality of field-effect transistors having a first drain-to-source spacing, and a second field-effect transistor of the plurality of field-effect transistors connected in series with the first field-effect transistor, the second field-effect transistor having a second drain-to-source spacing that is greater than the first drain-to-source spacing. The transistor stack may further comprise a third field-effect transistor of the plurality of field-effect transistors having a third drain-to-source spacing that is greater than the second drain-to-source spacing. In certain embodiments, the first field-effect transistor has a gate width that is shorter than a gate width of the second field-effect transistor.

In some implementations, the present disclosure relates to a method for fabricating a radio-frequency (RF) device. The method may comprise providing a semiconductor substrate, forming a first field-effect transistor (FET) over the semiconductor substrate, the first FET having a first plurality of gate fingers separated by a first gate-to-gate distance, and forming a second FET over the semiconductor substrate in a series connection with the first FET, the second FET having a second plurality of gate fingers separated by a second gate-to-gate distance, the second gate-to-gate distance being greater than the first gate-to-gate distance.

In certain embodiments, the first and second FETs are silicon-on-insulator (SOI) transistors. The first plurality of gate fingers may be more than the second plurality of gate fingers. The first plurality of gate fingers may have a first gate width that is shorter than a gate width of the second plurality of gate fingers. In certain embodiments, the first FET has a total periphery that is greater than a total periphery of the second FET. The first FET may have a total periphery that is greater than a total periphery of the second FET. In certain embodiments, the first FET has a first plurality of drain fingers having second level metal traces electrically coupled thereto to provide added capacitance. The first FET may occupy a smaller physical area than the second FET.

In certain embodiments, the method further comprises a third FET having a third plurality of gate fingers separated by a third gate-to-gate distance that is greater than the second gate-to-gate distance. The second plurality of gate fingers may have a gate width that is longer than a gate width of the first plurality of gate fingers and shorter than a gate width of the third plurality of gate fingers.

In some implementations, the present disclosure relates to a radio-frequency (RF) module comprising a packaging substrate configured to receive a plurality of devices, and a transistor stack mounted on the packaging substrate, the transistor stack including a first field-effect transistor (FET) disposed on the substrate, the first FET having a first plurality of gate fingers separated by a first gate-to-gate distance, and a second FET disposed on the semiconductor substrate in a series connection with the first FET, the second FET having a second plurality of gate fingers separated by a second gate-to-gate distance, the second gate-to-gate distance being greater than the first gate-to-gate distance.

In certain embodiments, the first and second FETs are silicon-on-insulator (SOI) transistors. The first plurality of gate fingers may be more than the second plurality of gate fingers. The first plurality of gate fingers may have a first gate width that is shorter than a gate width of the second plurality of gate fingers. The first FET may have a total periphery that is greater than a total periphery of the second FET. In certain embodiments, the first FET has a total periphery that is greater than a total periphery of the second FET. The first FET may have a first plurality of drain fingers having second level metal traces electrically coupled thereto to provide added capacitance. The first FET may occupy a smaller physical area than the second FET. In certain embodiments, the RF module further comprises a third FET having a third plurality of gate fingers separated by a third gate-to-gate distance that is greater than the second gate-to-gate distance. The second plurality of gate fingers may have a gate width that is longer than a gate width of the first plurality of gate fingers and shorter than a gate width of the third plurality of gate fingers.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION OF SOME EMBODIMENTS

The headings provided herein are for convenience only and do not necessarily affect the scope or meaning of the claimed invention.

Introduction

Disclosed herein are various examples of a field-effect transistor (FET) device having one or more regions relative to an active FET portion configured to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

Figure 1:
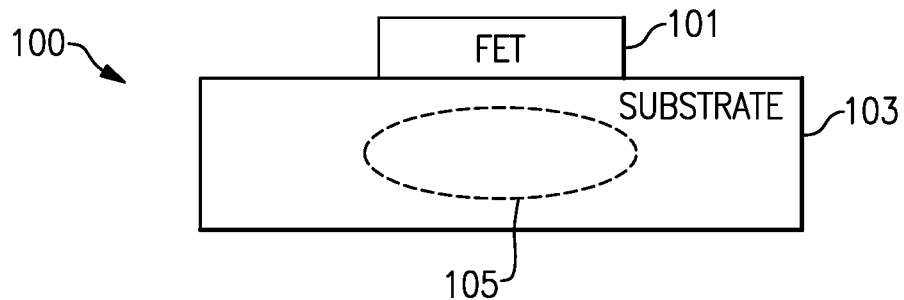
FIG. 1 shows an example of a field-effect transistor (FET) device having an active FET implemented on a substrate, and a region below the active FET configured to include one or more features to provide one or more desirable operating functionalities for the active FET.

FIG. 1 shows an example of a FET device 100 having an active FET 101 implemented on a substrate 103. As described herein, such a substrate can include one or more layers configured to facilitate, for example, operating functionality of the active FET, processing functionality for fabrication and support of the active FET, etc. For example, if the FET device 100 is implemented as a silicon-on-Insulator (SOI) device, the substrate 103 can include an insulator layer such as a buried oxide (BOX) layer, an interface layer, and a handle wafer layer.

FIG. 1 further shows that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
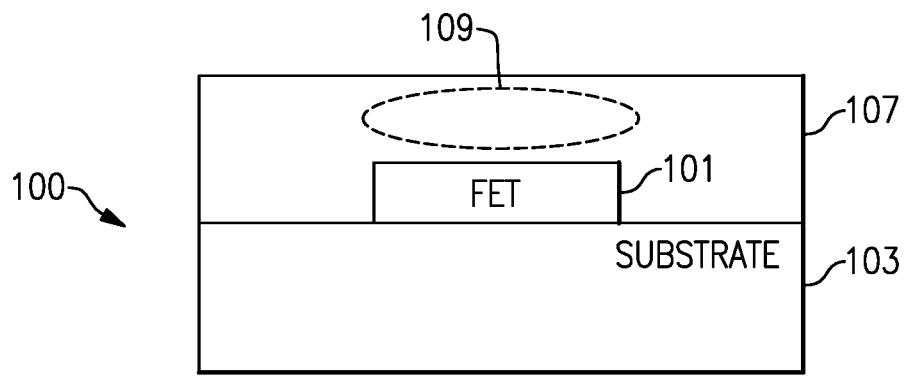
FIG. 2 shows an example of a FET device having an active FET implemented on a substrate, and a region above the active FET configured to include one or more features to provide one or more desirable operating functionalities for the active FET.

FIG. 2 shows an example of a FET device 100 having an active FET 101 implemented on a substrate 103. As described herein, such a substrate can include one or more layers configured to facilitate, for example, operating functionality of the active FET 100, processing functionality for fabrication and support of the active FET 100, etc. For example, if the FET device 100 is implemented as a silicon-on-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further shows that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
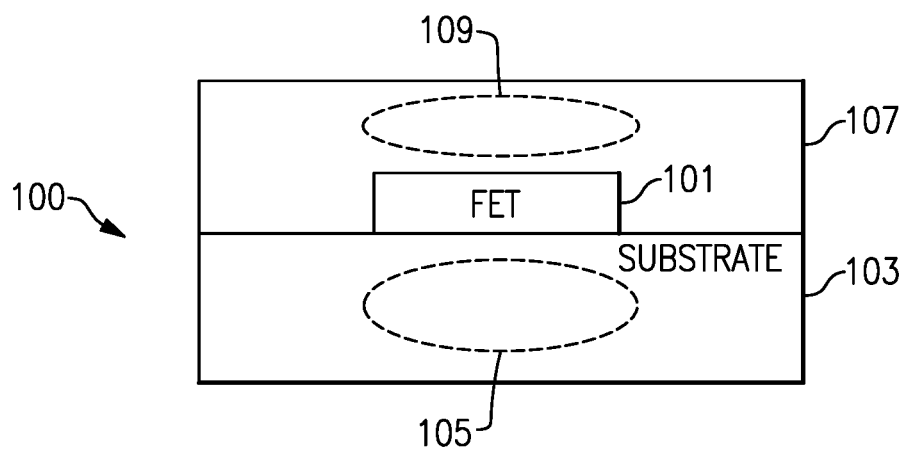
FIG. 3 shows that in some embodiments, a FET device can include both of the regions of FIGS. 1 and 2 relative to an active FET.

FIG. 3 shows an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
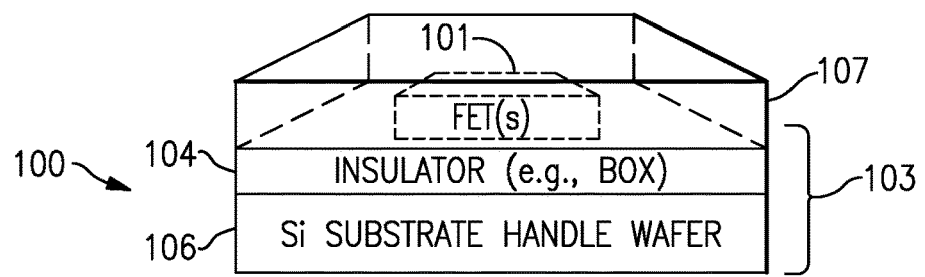
FIG. 4 shows an example FET device implemented as an individual silicon-on-insulator (SOI) unit.
Figure 5:
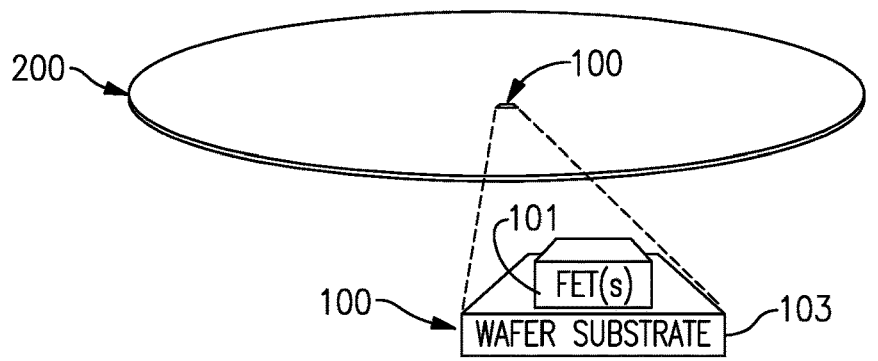
FIG. 5 shows that in some embodiments, a plurality of individual SOI devices similar to the example SOI device of FIG. 4 can be implemented on a wafer.

In the examples of FIGS. 1-3, the FET devices 100 are depicted as being individual units (e.g., as semiconductor die). FIGS. 4-6 show that in some embodiments, a plurality of FET devices having one or more features as described herein can be fabricated partially or fully in a wafer format, and then be singulated to provide such individual units.

For example, FIG. 4 shows an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIGS. 1-3, with or without the corresponding region 105.

In the example of FIG. 4, the individual SOI device 100 is shown to further include an upper layer 107. In some embodiments, such an upper layer can be the upper layer 103 of FIGS. 2 and 3, with or without the corresponding region 109.

FIG. 5 shows that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
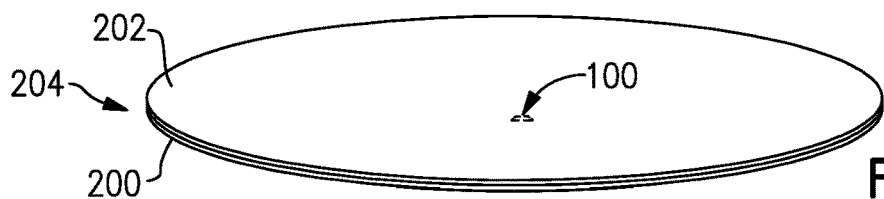
FIG. 6A shows an example wafer assembly having a first wafer and a second wafer positioned over the first wafer.
Figure 6B:
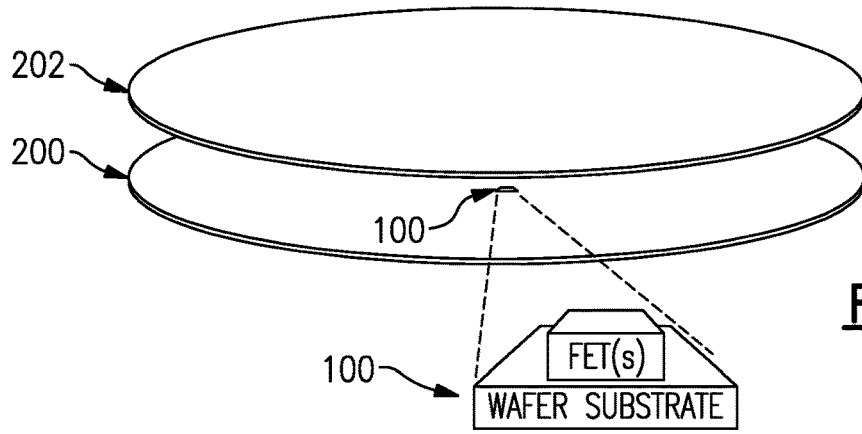
FIG. 6B shows an unassembled view of the first and second wafers of the example of FIG. 6A.

FIG. 6A shows an example wafer assembly 204 having a first wafer 200 and a second wafer 202 positioned over the first wafer 200. FIG. 6B shows an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Certain embodiments disclosed herein provide for performance and/or size improvement in transistor stacks using non-uniform drain-to-source spacing and/or other dimensional modifications. Principles and concepts disclosed herein may advantageously be implemented in connection with Silicon-on-Insulator (SOI) processes. Although certain embodiments are disclosed herein in the context of SOI technologies, it should be understood that the principles disclosed herein may be applicable to other transistor technologies as well.

SOI process technology is utilized in many radio-frequency (RF) circuits, including, for example, those involving high performance, low loss, high linearity switches. In such RF switching devices, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

An SOI transistor is viewed as a 4-terminal field-effect transistor (FET) device with gate, drain, source, and body terminals; or alternatively, as a 5-terminal device, with an addition of a substrate node. Such a substrate node can be biased and/or be coupled one or more other nodes of the transistor to, for example, improve linearity and/or loss performance of the transistor. Various examples related to SOI and/or other semiconductor active and/or passive devices are described herein in greater detail. Although various examples are described in the context of RF switches, it will be understood that one or more features of the present disclosure can also be implemented in other applications involving FETs and/or other semiconductor devices.

Figure 7A:
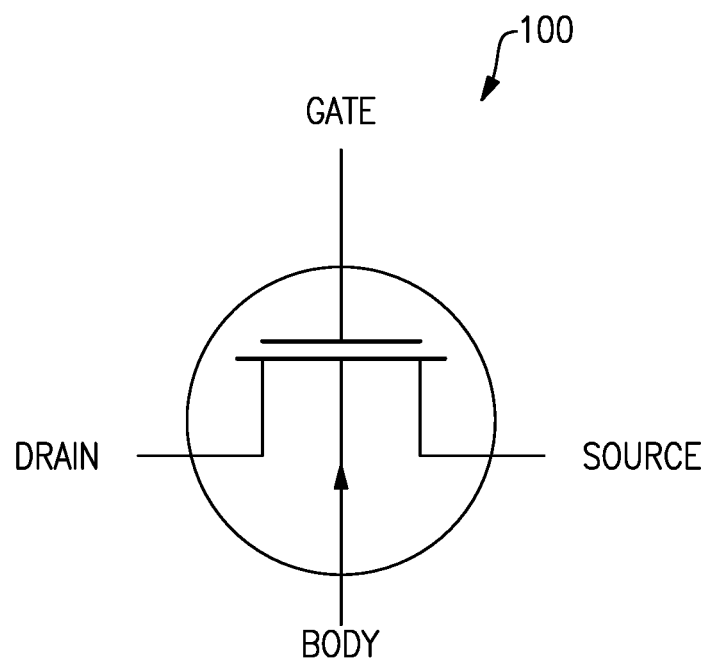
FIG. 7A shows a terminal representation of an SOI FET according to one or more embodiments.

FIG. 7A shows an example 4-terminal representation of an SOI FET 100 having nodes associated with a gate, a source, a drain and a body. It will be understood that in some embodiments, the source and the drain nodes can be reversed.

Figure 7B:
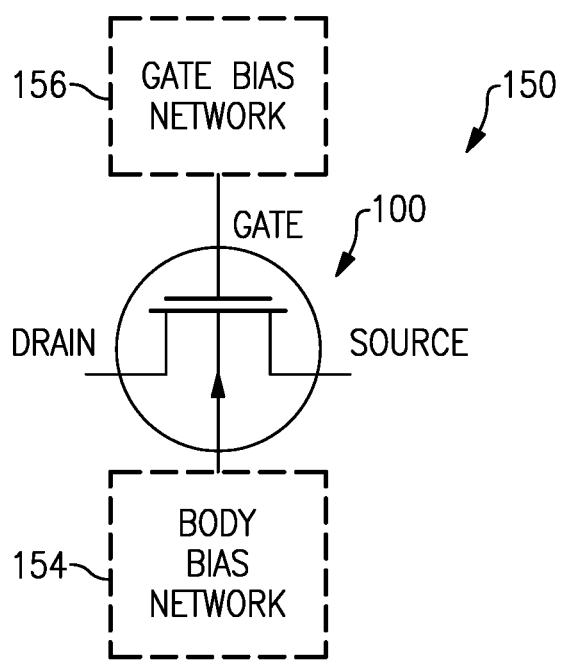
FIG. 7B shows a FET device according to one or more embodiments.

FIG. 7B shows that in some embodiments, an SOI FET 150 having one or more features as described herein can have its gate node biased by a gate bias network 156, its body node biased by a body bias network 154 and/or one or more additional nodes biased by a bias network. Examples related to such gate and body bias networks are described in U.S. Pub. No. 2014/0009274, titled "Circuits, Devices, Methods and Applications Related to Silicon-on-Insulator Based Radio-Frequency Switches," which is hereby incorporated by reference in its entirety.

Figure 8A:
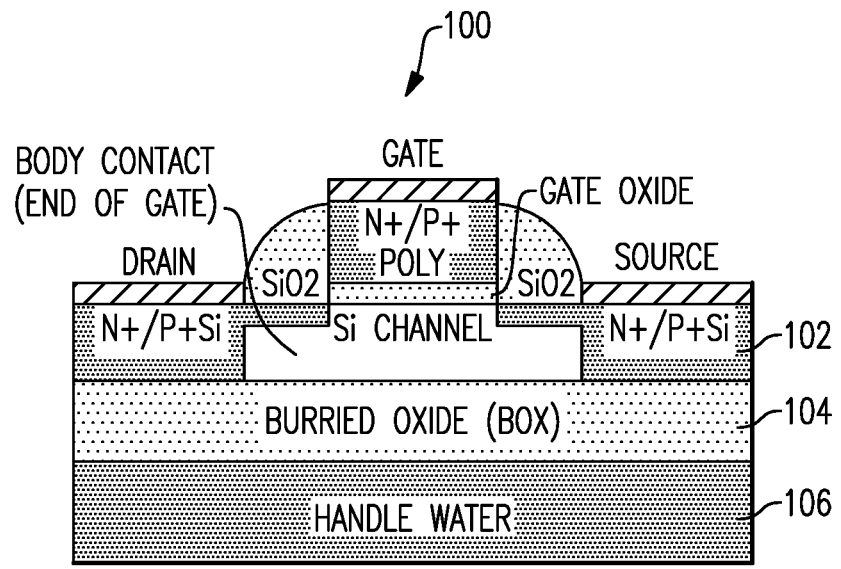
FIGS. 8A and 8B show side sectional and plan views, respectively, of an example SOI FET device according to one or more embodiments.
Figure 8B:
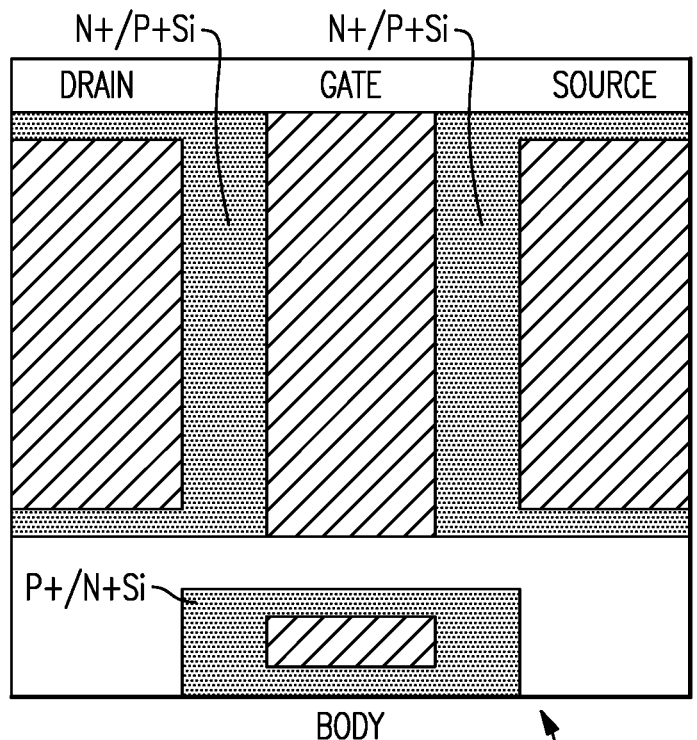

FIGS. 8A and 8B show side sectional and plan views of an example SOI FET 100. The substrate of the FET 100 can be, for example, a silicon substrate associated with a handle wafer 106. Although described in the context of such a handle wafer, it will be understood that the substrate does not necessarily need to have material composition and/or functionality generally associated with a handle wafer. Furthermore, handle wafer and/or other substrate layers like that shown in FIG. 8A may be referred to herein as "bulk substrate," "bulk silicon," "handle substrate," "stabilizing substrate," or the like, and may comprise any suitable or desirable material, depending on the application.

An insulator layer such as a buried oxide (BOX) layer 104 is shown to be formed over the handle wafer 106, and a FET structure is shown to be formed in an active silicon device 102 over the BOX layer 104. In various examples described herein, and as shown in FIGS. 8A and 8B, the FET structure can be configured as an NPN or PNP device.

In the examples of FIGS. 8A and 8B, terminals for the gate, source, drain and body are shown to be configured and provided so as to allow operation of the FET. The BOX layer 104 may be formed on the semiconductor substrate 106. In certain embodiments, the BOX layer 104 can be formed from materials such as silicon dioxide or sapphire. Source and drain may be p-doped (or n-doped) regions whose exposed surfaces generally define rectangles. Source/drain regions can be configured so that source and drain functionalities are reversed. FIGS. 8A and 8B further show that a gate can be formed so as to be positioned between the source and the drain. The example gate is depicted as having a rectangular shape that extends along with the source and the drain. The FET 100 may further include a body contact. Electrically conductive features such as conductive vias and/or trenches may be used to connect to the drain, source, gate and/or body terminals of the FET in certain embodiments. Various examples of how such an electrically conductive feature can be implemented are described herein in greater detail.

Formations of the source and drain regions, and/or the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried oxide layer. Such a configuration can provide, for example, reduced source/drain junction capacitance. To form a body contact for such a configuration, an additional gate region can be provided.

Figure 9:
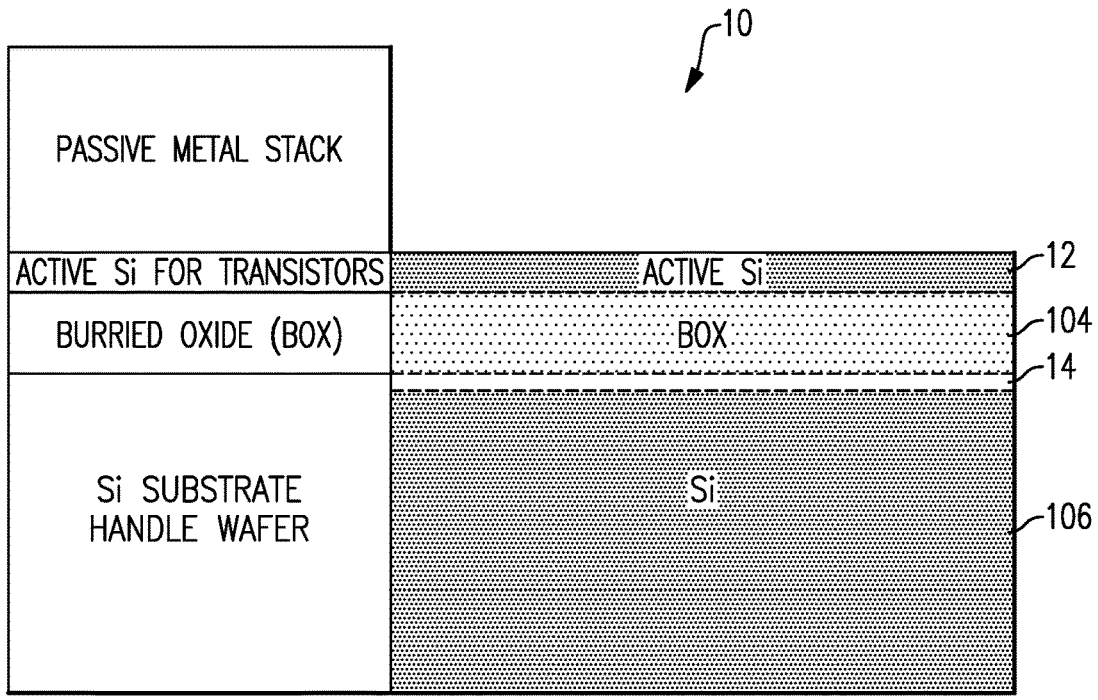
FIG. 9 shows a side sectional view of an SOI substrate that can be utilized to form an SOI FET device according to one or more embodiments.
Figure 10:
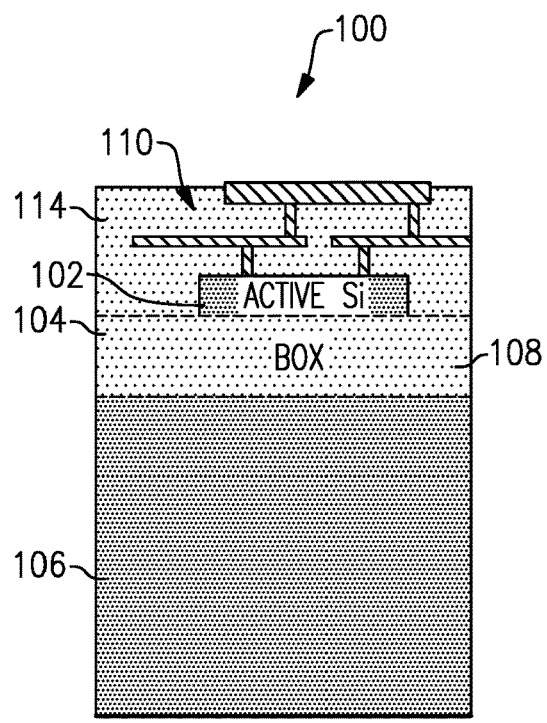
FIG. 10 shows a side sectional view of an SOI FET device according to one or more embodiments.

FIG. 9 shows a side sectional view of an SOI substrate 10 that can be utilized to form an SOI FET 100, as shown in FIG. 10, which may have an electrical connection for a substrate layer 106 (e.g., Si handle layer). In FIG. 9, an insulator layer such as a BOX layer 104 is shown to be formed over the Si handle layer 106. An active Si layer 12 is shown to be formed over the BOX layer 104.

In FIG. 10, an active Si device 102 is shown to be formed from the active Si layer 12 of FIG. 9. The device 100 includes a metal stack 110, which may facilitate electrical contact with the active Si device (e.g., a FET). In some embodiments, such a metal stack 110 can allow for certain conductive features of the FET 100 to be electrically connected to a terminal 112, or other electrically-coupled element. In the example of FIG. 10, a passivation layer 114 can be formed to cover some or all of the connections/metal stack 110 and/or active device 102.

In some embodiments, a trap-rich layer 14 can be implemented between the BOX layer 104 and the Si handle layer 106. In certain embodiments, an electrical connection to the Si handle layer 106 through one or more conductive feature (s) (e.g., substrate contact; not shown in the embodiment of FIG. 10) can eliminate or reduce the need for such a trap-rich layer, which is typically present to control charge at an interface between the BOX layer 104 and the Si handle layer 106, and can involve relatively costly process steps.

Figures 11, 12:
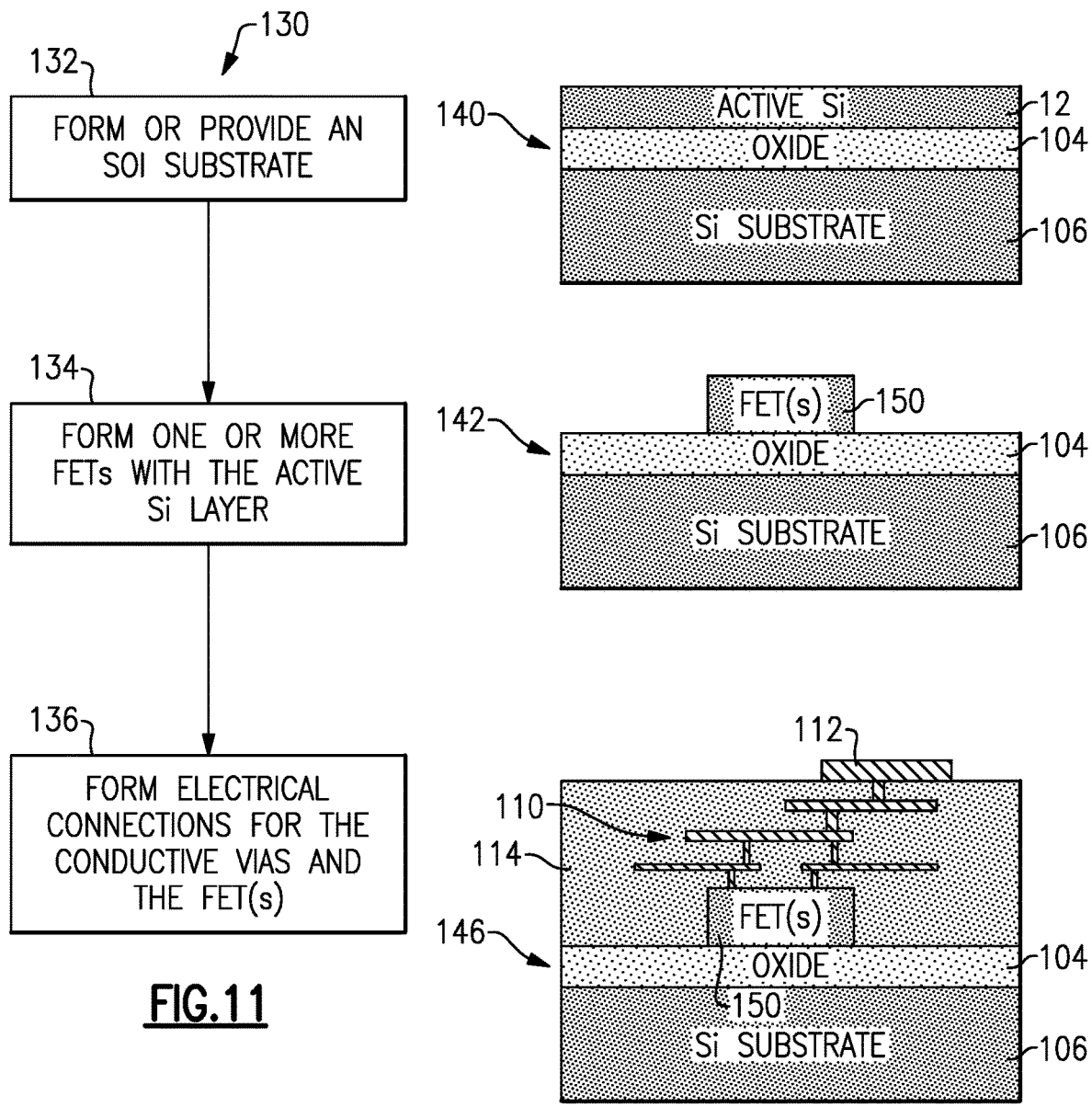
FIG. 11 shows a process that can be implemented to facilitate fabrication of an SOI FET device having one or more features as described herein.
FIG. 12 shows examples of various stages of the fabrication process of FIG. 11.

FIG. 11 shows a process 130 that can be implemented to fabricate an SOI FET having one or more features as described herein. FIG. 12 shows examples of various stages/structures associated with the various steps of the fabrication process of FIG. 11.

In block 132 of FIG. 11, an SOI substrate can be formed or provided. In state 140 of FIG. 12, such an SOI substrate can include an Si substrate 106 such as an Si handle layer, an oxide layer 104 over the Si substrate 106, and an active Si layer 12 over the oxide layer 104. Such an SOI substrate may or may not have a trap-rich layer between the oxide layer 104 and the Si substrate 106.

In block 134 of FIG. 11, one or more FETs can be formed with the active Si layer. In state 142 of FIG. 12, such FET(s) is depicted as 150.

In the example of FIGS. 11 and 12, it will be understood that the various blocks of the process 130 may or may not be performed in the example sequence shown. In some embodiments, conductive feature(s) such as one or more deep trenches can be formed and filled with poly prior to the formation of the FET(s). In some embodiments, such conductive feature(s) can be formed (e.g., cut and filled with a metal such as tungsten (W) after the formation of the FET(s). It will be understood that other variations in sequences associated with the example of FIGS. 11 and 12 can also be implemented.

In block 136 of FIG. 11, electrical connections can be formed for the FET(s). In state 146 of FIG. 12, such electrical connections are depicted as a metallization stack collectively identified by reference number 110. Such a metal stack 110 can electrically connect the FET(s) 150 to one or more terminals 112, or other electrical element or device (e.g., active or passive device). In the example state 146 of FIG. 12, a passivation layer 114 is shown to be formed to cover some or all of the connections/metallization stack 110 and/or FET(s) 150.

Figure 13:
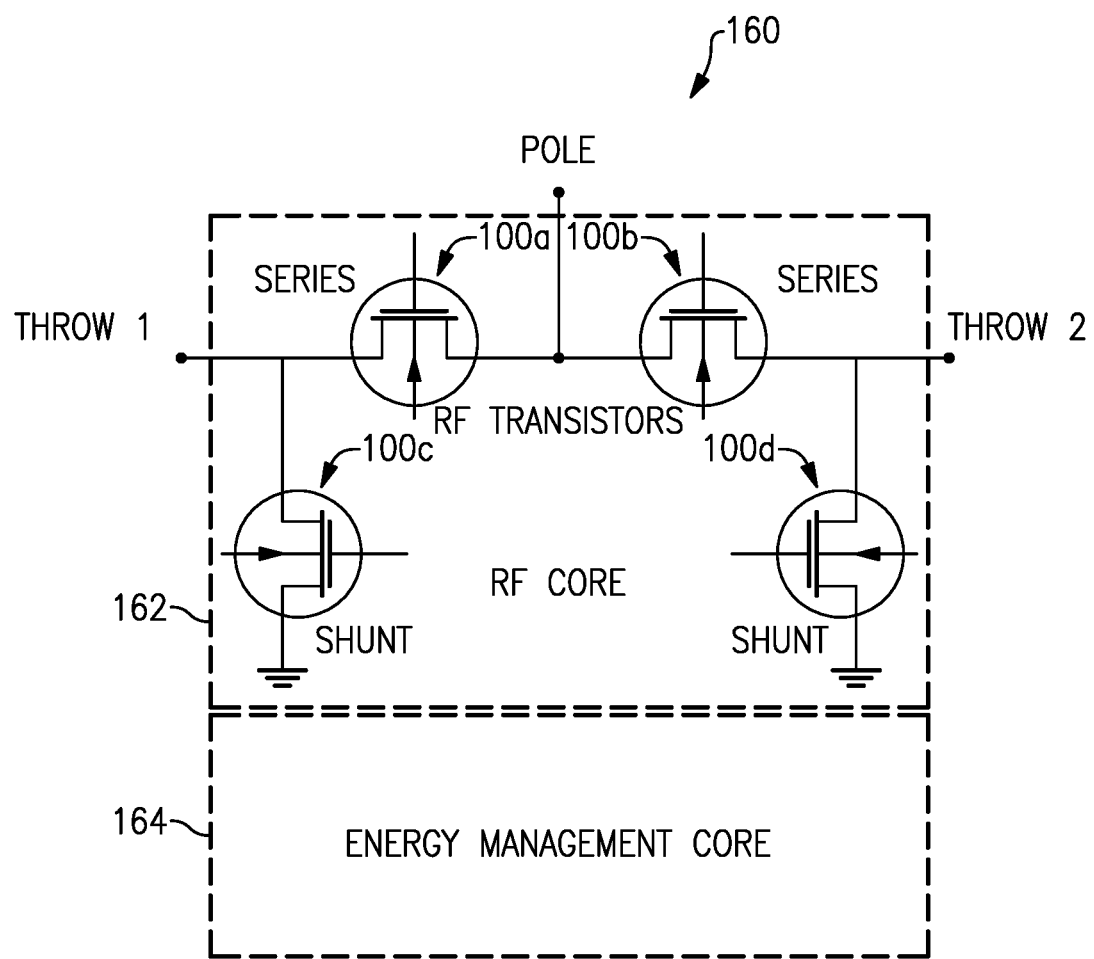
FIG. 13 shows an example of a radio-frequency (RF) switching configuration having an RF core and an energy management (EM) core.
Figure 14:
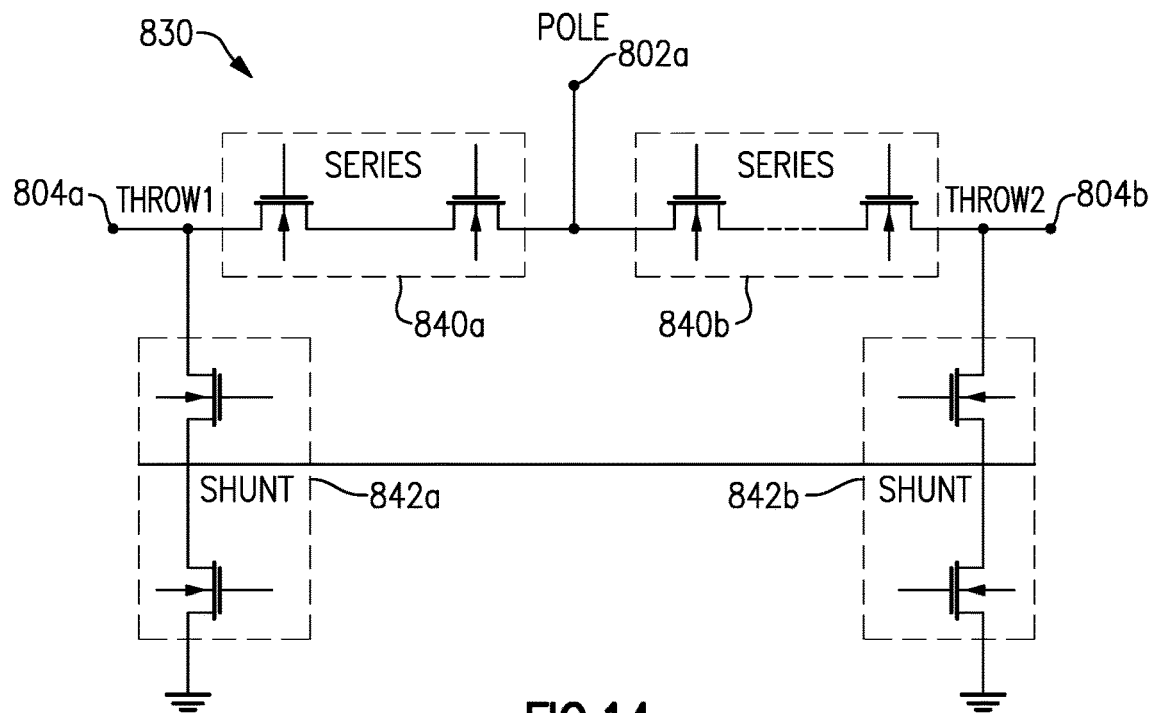
FIG. 14 shows an example of the RF core of FIG. 13, in which each of the switch arms includes a stack of FET devices.
Figure 15:
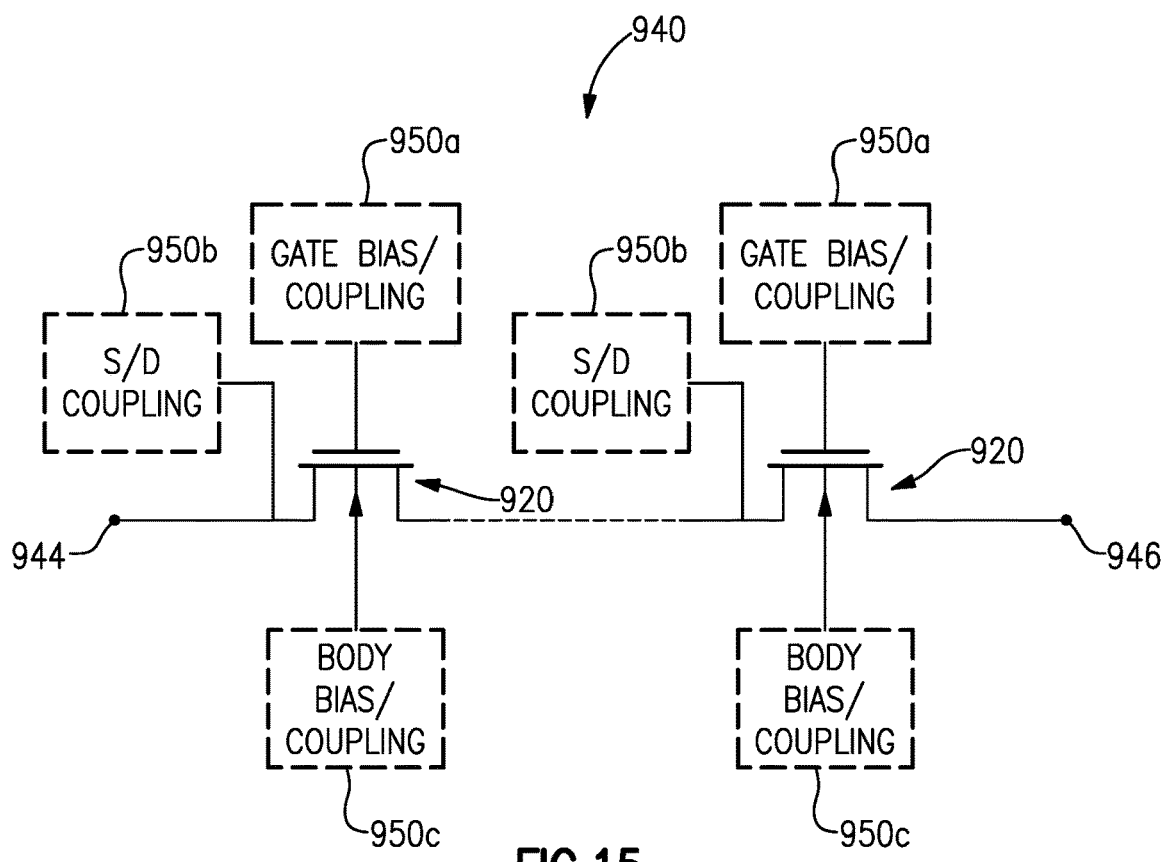
FIG. 15 shows an example biasing configuration implemented in a switch arm having a stack of FETs.

FIGS. 13-15 show that in some embodiments, SOI FETs having one or more features as described herein can be implemented in RF switching applications.

FIG. 13 shows an example of an RF switching configuration 160 having an RF core 162 and an energy management (EM) core 164. Additional details concerning such RF and EM cores are described in U.S. Pub. No. 2014/0009274, titled "Circuits, Devices, Methods and Applications Related to Silicon-on-Insulator Based Radio-Frequency Switches," which is incorporated by reference herein in its entirety. The example RF core 162 of FIG. 13 is shown as a single-pole-double-throw (SPDT) configuration in which series arms of transistors 100a, 100b are arranged between a pole and first and second throws, respectively. Nodes associated with the first and second throws are shown to be coupled to ground through their respective shunt arms of transistors 100c, 100d.

In the example of FIG. 13, the transistors between the pole node and the two throw nodes are depicted as single transistors. In some implementations, such switching functionalities between the pole(s) and the throw(s) can be provided by switch arm segments, where each switch arm segment includes a plurality of transistors such as FETs.

An example RF core configuration 830 of an RF core having such switch arm segments is shown in FIG. 14. In the example, the pole 802a and the first throw node 804a are shown to be coupled via a first switch arm segment 840a. Similarly, the pole 802a and the second throw node 804b are shown to be coupled via a second switch arm segment 840b. The first throw node 804a is shown to be capable of being shunted to an RF ground via a first shunt arm segment 842a. Similarly, the second throw node 804b is shown to be capable of being shunted to the RF ground via a second shunt arm segment 842b.

In an example operation, when the RF core 830 is in a state where an RF signal is being passed between the pole 802a and the first throw node 804a, all of the FETs in the first switch arm segment 840a can be in an ON state, and all of the FETs in the second switch arm segment 804b can be in an OFF state. The first shunt arm 842a for the first throw node 804a can have all of its FETs in an OFF state so that the RF signal is not shunted to ground as it travels from the pole 802a to the first throw node 804a. All of the FETs in the second shunt arm 842b associated with the second throw node 804b can be in an ON state so that any RF signals or noise arriving at the RF core 830 through the second throw node 804b is shunted to the ground so as to reduce undesirable interference effects to the pole-to-first-throw operation.

Again, although described in the context of an SP2T configuration, it will be understood that RF cores having other numbers of poles and throws can also be implemented.

In some implementations, a switch arm segment (e.g., 840a, 840b, 842a, 842b) can include one or more semiconductor transistors such as FETs. In some embodiments, an FET may be capable of being in a first state or a second state and can include a gate, a drain, a source, and a body (sometimes also referred to as a substrate). In some embodiments, an FET can include a metal-oxide-semiconductor field-effect transistor (MOSFET). In some embodiments, one or more FETs can be connected in series forming a first end and a second end such that an RF signal can be routed between the first end and the second end when the FETs are in a first state (e.g., ON state). In the example shown in FIG. 15, the gate of each of the FETs 920 in a switch arm 940 can be connected to a gate bias/coupling circuit to receive a gate bias signal and/or couple the gate to another part of the FET 920 or the switch arm 940. In some implementations, designs or features of the gate bias/coupling circuit(s) (e.g., 150a) can improve performance of the switch arm 940. Such improvements in performance can include, but are not limited to, device insertion loss, isolation performance, power handling capability and/or switching device linearity.

Non-Uniform Drain-to-Source Spacing

Parasitic capacitance to ground may be a factor of transistor layout, oxide thickness, and/or substrate thickness. Certain embodiments disclosed herein provide systems and processes for compensating for performance degradation due to parasitic capacitance in transistor stacks through the use of non-uniform drain-to-source spacing and/or other dimensional modifications to provide non-uniform capacitance across stack devices. Such features may provide improved performance and/or reduction in size for transistors compared to certain conventional transistor devices. The non-uniform drain-to-source spacing embodiments disclosed herein may be applicable to any FET-based technology, such as SOI, CMOS, PHEMT, MESFET, or other FET or transistor type. Furthermore, transistor stacks configured with non-uniform drain-to-source spacing may be applicable to switching, amplifying, mixing, or other applications or solutions applications. Drain-to-source spacing in transistor devices is discussed herein in connection with various embodiments and benefits. In certain embodiments, modifying drain-to-source spacing in a transistor can be correlated with corresponding modification in gate-to-gate spacing between adjacent gate fingers of a transistor. Therefore, discussion and references herein to drain-to-source spacing reduction or other modification should be understood to possibly correspond to similar reduction or modification to gate-to-gate spacing. For example, in certain embodiments, drain-to-source spacing in a transistor may be substantially equal to gate-to-gate spacing within the transistor. In certain embodiments, reduction or modification in drain-to-source spacing in a transistor is proportional to reduction or modification in gate-to-gate spacing. Furthermore, relative difference in drain-to-source spacing of different transistors in a transistor stack may correspond with relative difference in gate-to-gate spacing of the transistors in the transistor stack. In certain embodiments, the relative difference in drain-to-source spacing of different transistors in a transistor stack is proportional to the relative difference of gate-to-gate spacing of the transistors in the transistor stack.

Figure 16:
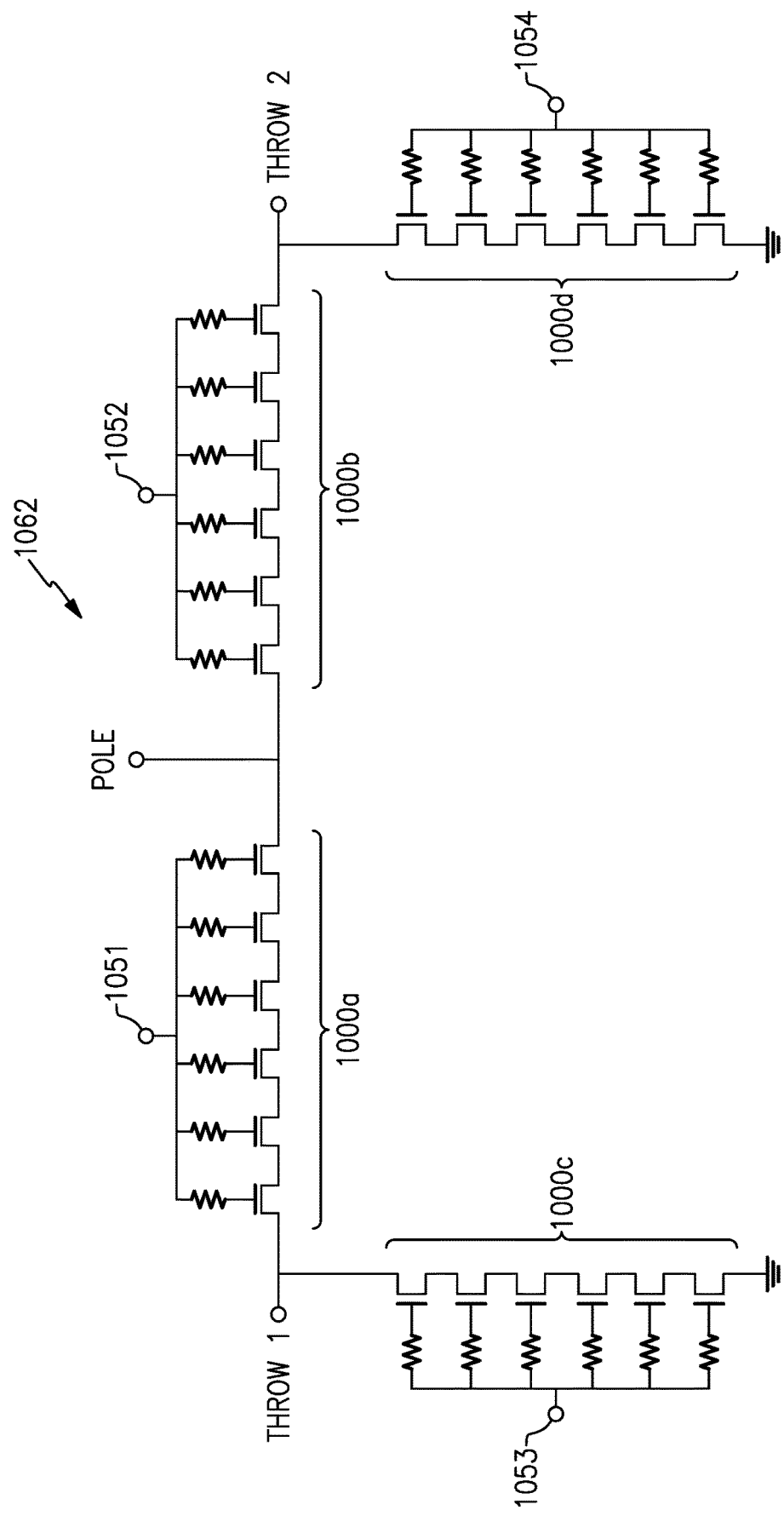
FIG. 16 shows an example of an RF core according to one or more embodiments.

FIG. 16 shows an example of a radio-frequency (RF) core 1062 according to one or more embodiments. The circuit 1062 is illustrated as a single-pole-double-throw (SPDT) switch. However, one having ordinary skill in the art will appreciate that principles and features disclosed herein may be applicable in other types of circuits or devices.

The RF core 1062 includes multiple transistors (e.g., FETs) 1000a in a series stack, which may be utilized to provide relatively high-voltage handling and/or high-linearity performance for one or more applications. The transistor stack 1000a may include a plurality of transistors so that the relatively high voltage may be handled by lower-voltage transistors. That is, the RF voltage present at the pole may be greater than a single transistor may be configured to handle. FETs and/or other transistor devices may suffer from certain parasitic capacitances due to the underlying substrate (Club) under various conditions. For example, parasitic capacitance between a drain/source well and ground may be present in SOI and/or other processes. Such parasitic capacitance may be affected by various factors, such as transistor area, oxide thickness, bulk substrate type, and/or the like.

Figure 17:
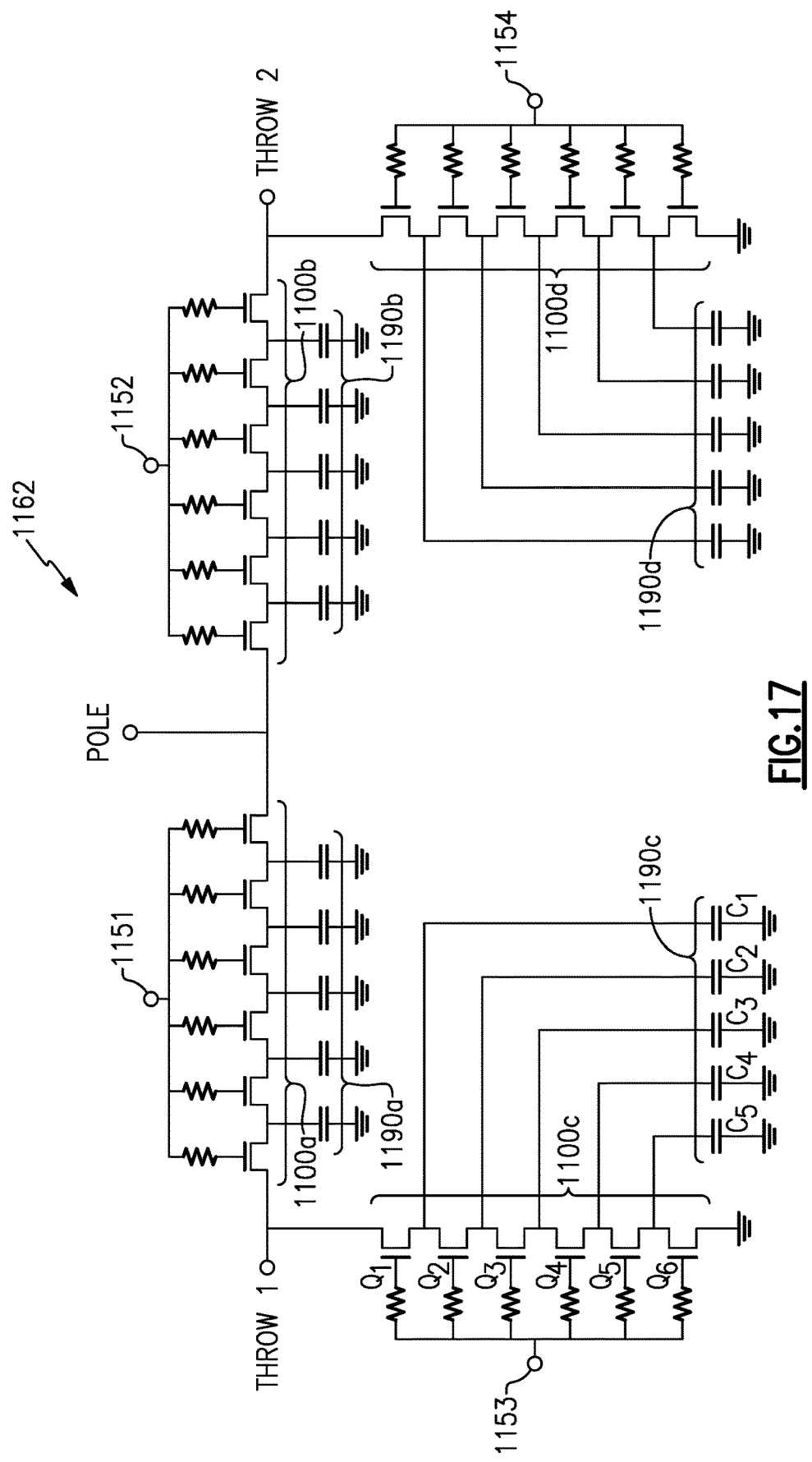
FIG. 17 shows an example of an RF core according to one or more embodiments.

FIG. 17 shows an example of a radio-frequency (RF) core 1162 according to one or more embodiments. Certain parasitic capacitances associated with the various transistor devices is illustrated in the diagram of FIG. 17. Each FET of a transistor stack (e.g., series or shunt stack) may have a parasitic capacitance to ground. For example, the illustrated capacitance $C_1$ may represent a parasitic capacitance associated with $Q_1$ and/or $Q_2$. In certain embodiments, each transistor in a transistor stack may be a similar parasitic capacitance to ground. It may generally not be possible to eliminate or decrease the parasitic capacitance through the box layer of an SOI device to the backside wafer, and so compensation for such capacitance may be desirable in certain processes.

In certain embodiments, the parasitic capacitance associated with a first transistor in a stack may have a relatively more detrimental effect on the performance of the associated transistor than the effect of parasitic capacitance on a following transistor in the stack; for example, the capacitance $C_1$ may have a more detrimental effect on transistor $Q_1$ than capacitance $C_5$ has on transistor $Q_5$. This may be due in part to the RF voltage present at the gate of $Q_1$ being greater than at gates of subsequent transistors that are closer to ground. Therefore, due to the uneven effect of capacitance on the various transistors, uneven voltage division may occur across the stack of transistors.

Figure 18:
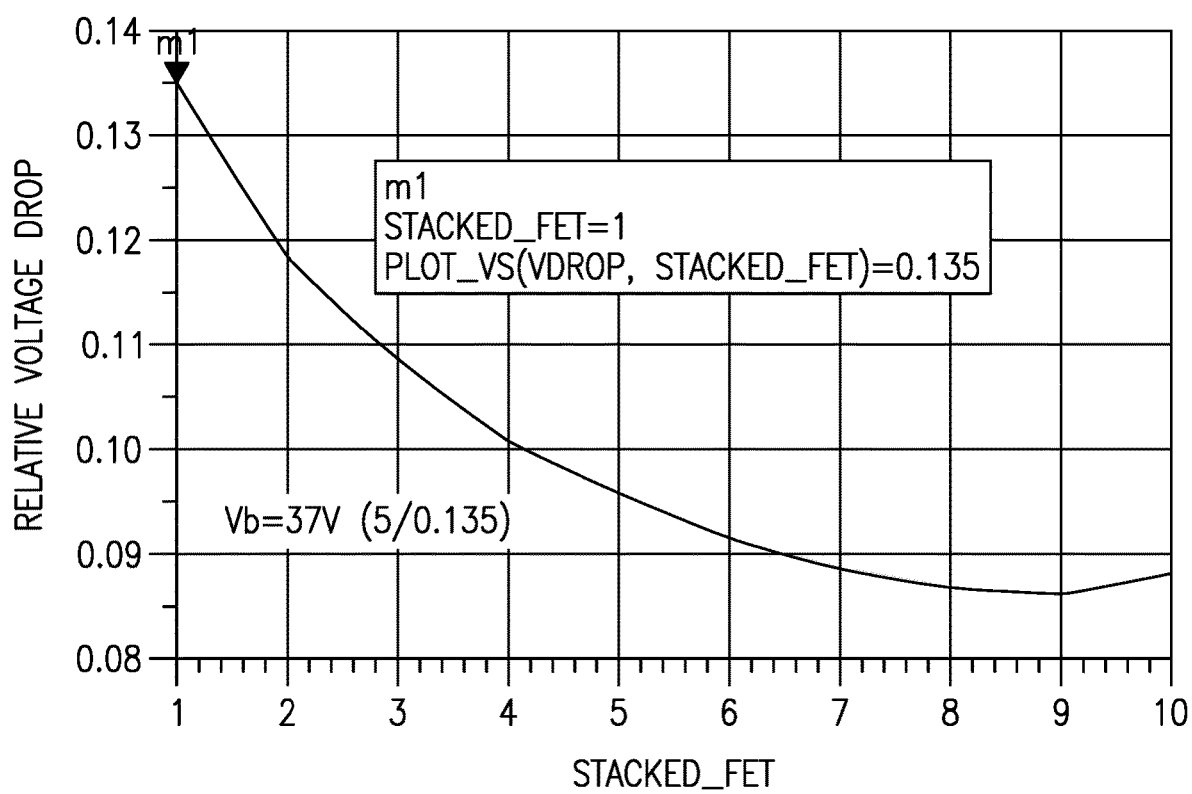
FIG. 18 is a graph illustrating possible drain-to-source voltages across transistors in a transistor stack according to one or more embodiments.

FIG. 18 is a graph illustrating possible drain-to-source voltages across transistors in a transistor stack according to one or more embodiments. The graph of FIG. 18 provides an example of simulated data where relative voltage drop at each of the FETs is plotted against the FET number along the stack. For example, there may be a voltage drop of about 0.135 of the input voltage (5V in this example) across a first FET in a transistor stack, about 0.118 of the input voltage across a second FET, and so on.

In FIG. 18, one can readily see that there can be significant imbalance of voltage drop values along the stack. It should be understood that for other configurations and architectures having constant gate width, voltage imbalances may also be similar to, the example of FIG. 18. Such voltage imbalances may or may not closely follow the example of FIG. 18, but the general trend is typically similar, where the first FET (where the power is incident) is typically the limiting factor with the highest voltage drop. As described herein, such an uneven voltage distribution along the stack can result in degradation of switch performance with respect to, for example, harmonic peaking, compression point and/or intermodulation distortion (IMD). Also, at higher power levels, the first FET can go into breakdown before other FETs, thereby limiting the overall performance of the switch.

It is further noted that such an uneven voltage distribution can impact the breakdown voltage performance of the stack. For example, suppose that an input voltage of 5V is provided at an input of a stack having 10 FETs, and that voltage drop across each FET is substantially constant (e.g., 0.1 of the input voltage, or 0.5V, for the 10-FET example) so that there is no voltage imbalance within the stack. Also assume that each FET is capable of handling at least the example 5V without breaking down. Since each FET can handle 5V, and since there is no voltage imbalance, one can expect that the example stack as a whole can handle 10 times 5V, or 50V.

In a stack with an uneven voltage distribution, one can expect that a FET with the highest relative voltage drop will break down first when the input voltage is increased, thereby yielding a weak link within the stack. In the example of FIG. 18, such a weak link may be the first FET, which has the highest relative voltage drop value of approximately 0.135. Accordingly, a degraded breakdown voltage Vb for the example stack of FIG. 18 can be estimated by scaling the input voltage (e.g., 5V) with the highest relative voltage drop value (0.135), as 5/0.135, or approximately 37V. Compared to the foregoing example of 50V for the constant-voltage drop (among the FETs), 37V is a significant reduction in voltage handling capability of the example stack represented in FIG. 18.

In view of the negative effects of uneven voltage distribution as illustrated in FIG. 18, it may be desirable to implement features that promote more even voltage distribution across a transistor stack, which may ultimately result in more total voltage across the whole stack before any one of the transistors breaks down. The effect of uneven voltage distribution may be at least partially mitigated by adding drain-to-source fixed capacitance on one or more (but not all) of the transistors of the stack, such as on one or more transistors that experience relatively higher voltage levels; adding capacitance across drain-to-source may at least partially reduce the drain-to-source voltage for a respective transistor, which may promote more even voltage distribution across all transistors (e.g., FETs) in the stack. Certain systems and methods for compensating for uneven voltage distribution in transistor stacks are disclosed herein, as well as in U.S. Pub. No. 2015/0041917, titled "Field-Effect Transistor Stack Voltage Compensation," filed on Aug. 4, 2014, the disclosure of which is hereby expressly incorporated by reference herein in its entirety.

Figure 19:
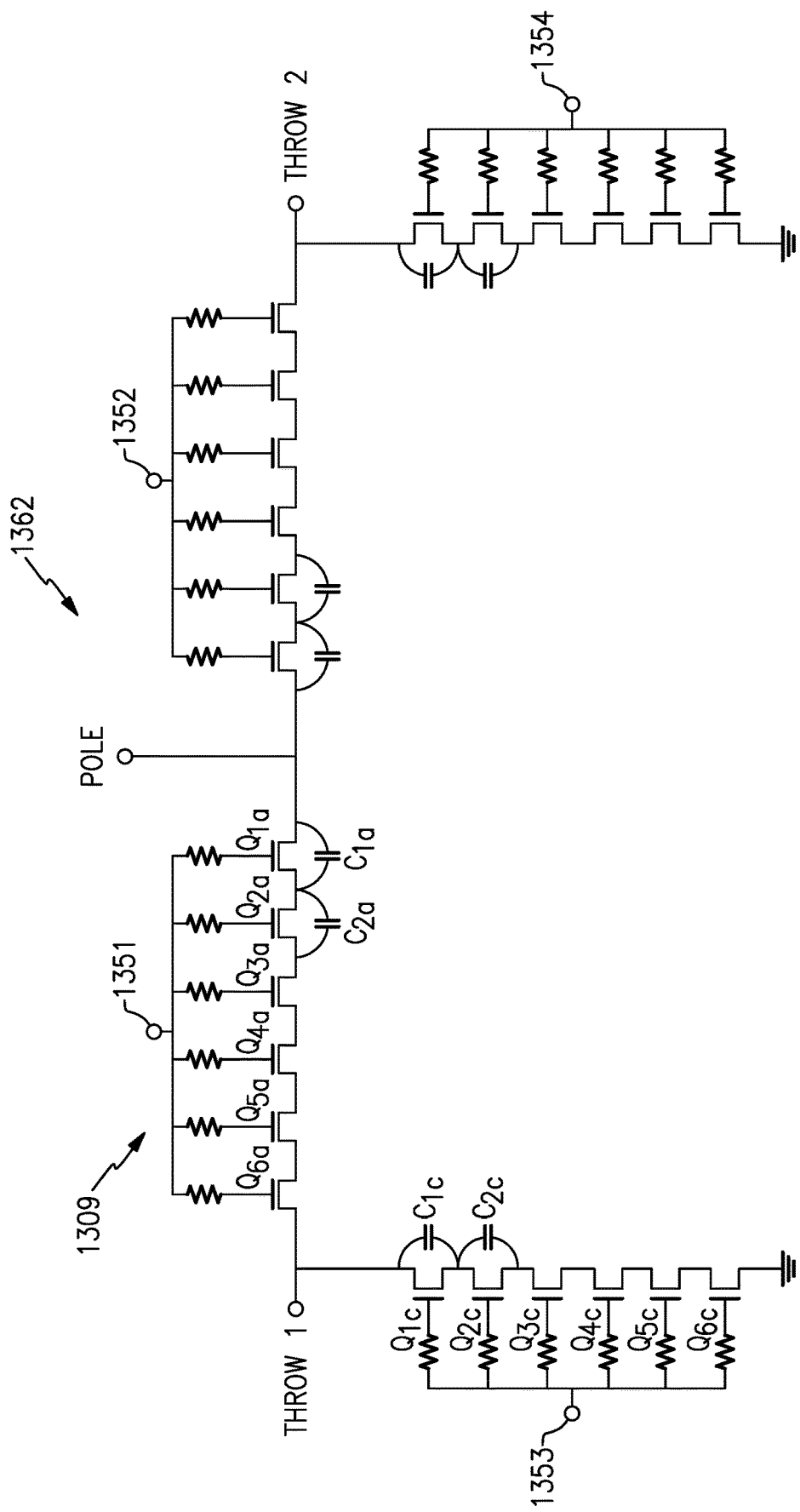
FIG. 19 shows an example of an RF core according to one or more embodiments.

Selective addition of capacitance to one or more transistors of the stack may be achieved in various ways. FIG. 19 shows an example of a radio-frequency (RF) core according to one or more embodiments, wherein one or more transistors of a series or shunt transistor stack is at least partially bypassed by adding a drain-to-source capacitance. The capacitors ($C_{1a}$, $C_{2a}$, $C_{1c}$, $C_{2c}$) may at least partially compensate for uneven RF voltage distribution across the respective transistor stacks. For example, with respect to the series stack including transistors $Q_{1a}$-$Q_{6a}$, the collective RF voltages across the stack may become at least partially more uniform in the presence of the added capacitors $C_{1a}$ and $C_{2a}$. In certain embodiments, adding one or more drain-to-source capacitors may allow for some or all of the transistors of the stack to have similar voltages, which may allow for a relatively higher total voltage-handling and/or linearity performance capability for the stack.

In certain embodiments, a first capacitor $C_{1a}$ of the stack may be associated with a capacitor with a higher capacitance value than one or more capacitors (e.g., $C_{2a}$) associated with subsequent transistor(s) (e.g., $Q_{2a}$) of the stack. Although the illustrated embodiment of FIG. 19 only shows capacitors ($C_{1a}$, $C_{2a}$) associated with the first two transistors ($Q_{1a}$, $Q_{2a}$) of the series stack 1300a, it should be understood that any number or selection of transistors of the stack may be at least partially bypassed by added capacitance in certain embodiments. Where only a subset of transistors is associated with added capacitance, such capacitance may advantageously be associated with front-side transistors.

Added capacitance on selected transistors may be accomplished by adding fixed metal-insulator-metal (MIM) (e.g., lumped element MIM capacitor(s)) capacitors to drain and source nodes of the respective transistors. Additionally or alternatively, capacitance may be achieved by adding additional metal to the respective transistor fingers, thereby providing interdigitated capacitor(s).

Generally, added drain-to-source capacitance, as described above, may be implemented in connection with transistor stacks comprising transistors having uniform drain-to-source spacing. For example, transistors such as FETs may be laid out with drain-to-source spacing that is generally larger than manufacturing standard requirements in order to maintain relatively low capacitance, which may be desirable in certain respects for at least some transistors of the stack. However, such uniform drain-to-source spacing can lead to the uneven voltage distribution issues described above. Certain embodiments disclosed herein provide improved voltage distribution across transistor stacks by creating higher capacitance for at least one of the top/front transistors in the stack at least in part by changing the actual transistor drain-to-source distance for selected transistors relative to other transistor(s) of the stack, which may be correlated with change in gate-to-gate distance between adjacent gate fingers, as explained above.

The method of adding additional drain-to-source capacitance using non-uniform drain-to-source spacing may provide certain benefits in transistor stacks over those having uniform drain-to-source distances, such as reduced size, and/or lower resistance, which may decrease RF losses. In certain embodiments, only a subset of transistors of a stack may have added capacitance from modified drain-to-source (and/or gate-to-gate) spacing, wherein spacing is designed to provide decreasing capacitance values in one direction, such as in a direction of signal transmission. For example, $C_{1a}$ and/or $C_{1c}$ may have higher capacitance values than subsequent transistors $C_{2a}$ and/or $C_{2c}$, respectively. In an embodiment, a transistor stack implementing non-uniform drain-to-source (and/or gate-to-gate) spacing may comprise approximately twelve transistors, wherein a subset of transistors, such as approximately four, may have added capacitance. In an embodiment, capacitance is added to each of the transistors of the stack with the exception of the last transistor.

Figure 20A:
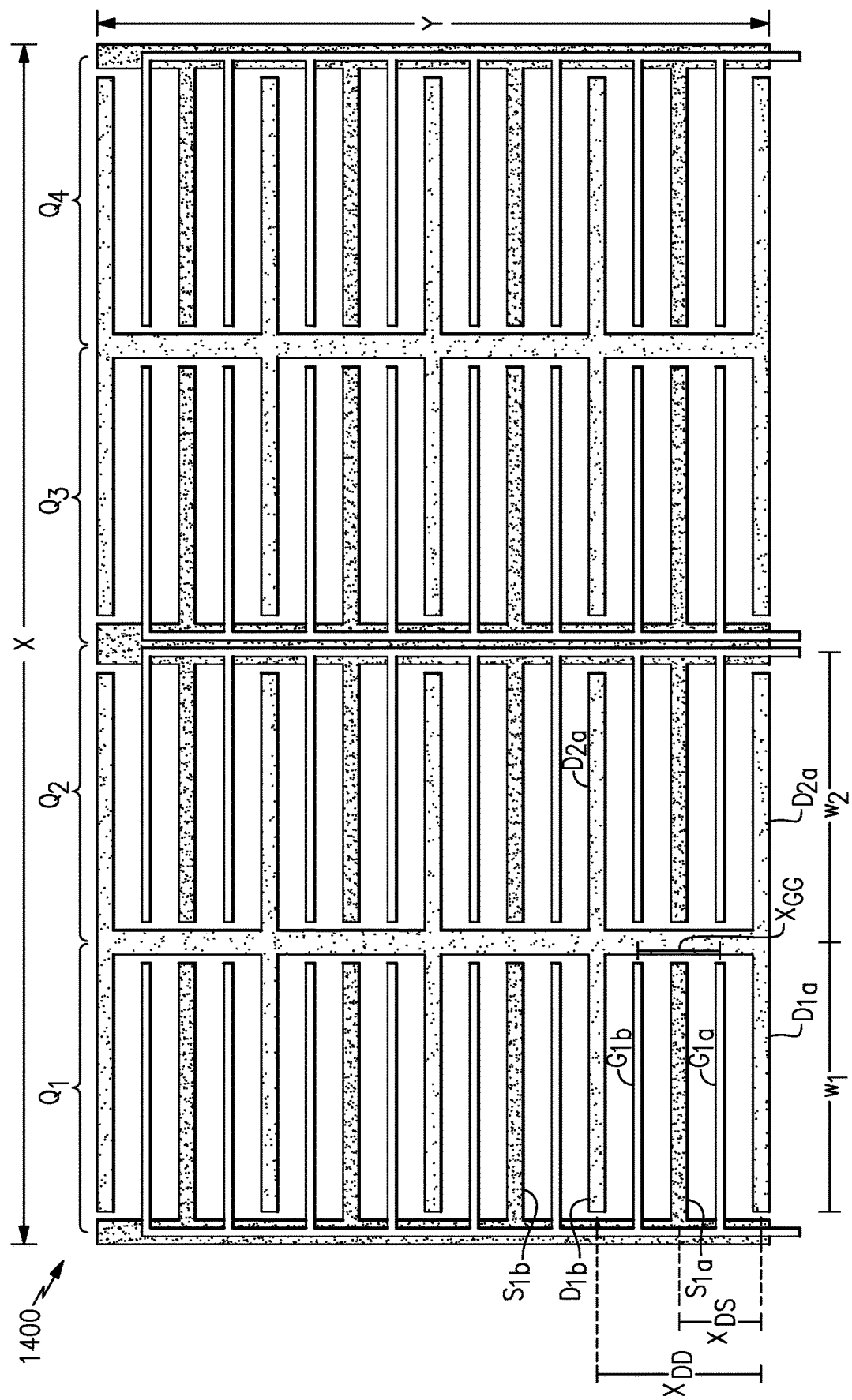
FIG. 20A shows a plan view of an example transistor stack according to one or more embodiments.

FIG. 20A shows a plan view of an example transistor stack according to one or more embodiments. The transistor stack illustrated in FIG. 20A includes four transistors ($Q_1$-$Q_4$), each with a certain number of fingers. However, it should be understood that principles disclosed herein may be applicable to transistor stacks comprising any number of transistors and/or transistors having any number of fingers, and even transistors having a single gate, drain and/or source finger. In the transistor stack 1400, each of the transistors $Q_1$-$Q_4$ may have similar characteristics and/or dimensions and may be designed to achieve relatively-low drain-to-source capacitance. However, in certain embodiments, wherein drain-to-source spacing is not placed at relatively minimal values, which may provide relatively minimal total metal-to-metal capacitance, uneven voltage distribution may result, as described above.

Certain dimensions of the transistor stack 1400 and transistors thereof are shown. However, it should be understood that such dimensions are not necessarily drawn to scale and may have any desirable or suitable values and still fall within the scope of the present disclosure. The transistors $Q_1$-$Q_4$ may each have similar dimensions. Therefore, the dimensions of the transistor stack 1400 may be understood with reference to $Q_1$ and/or $Q_2$, as diagrammed in FIG. 20A. In certain embodiments, $Q_1$ may have a total area of approximately 2475 µm² and a total gate width length of approximately 2 mm. The total area of the transistor $Q_1$ may be based on the width $w_1$ of the transistor multiplied by the total length Y of the transistor. The total gate "width" and/or "transistor periphery" may represent the aggregate length of all of the individual gate fingers ($G_{1a}$-$G_{1n}$) of the transistor $Q_1$. The total gate width of the transistor may at least partially determine device performance characteristics, such as ON-resistance, which it may be desirable to maintain at a relatively low level in certain situations. The gate width may be based on a finger count of approximately 133, or other number, with a finger width $w_1$ of approximately 15 µm. In certain embodiments, the drain-to-source spacing $X_{DS}$ may be approximately 0.84 µm, with a total drain-to-drain or source-to-source distance $X_{DD}$ of approximately 1.68 µm. As explained above, references herein to drain-to-source spacing may further be representative of gate-to-gate spacing in certain embodiments.

The transistor $Q_1$, based on specifications similar to those listed above, may have an ON-resistance of approximately 0.35 Ohm and OFF-capacitance of approximately 306 fF. Therefore, the combination of On-resistance and OFF-capacitance may be represented by Ron*Coff (fs)≈107.

Figure 20B:
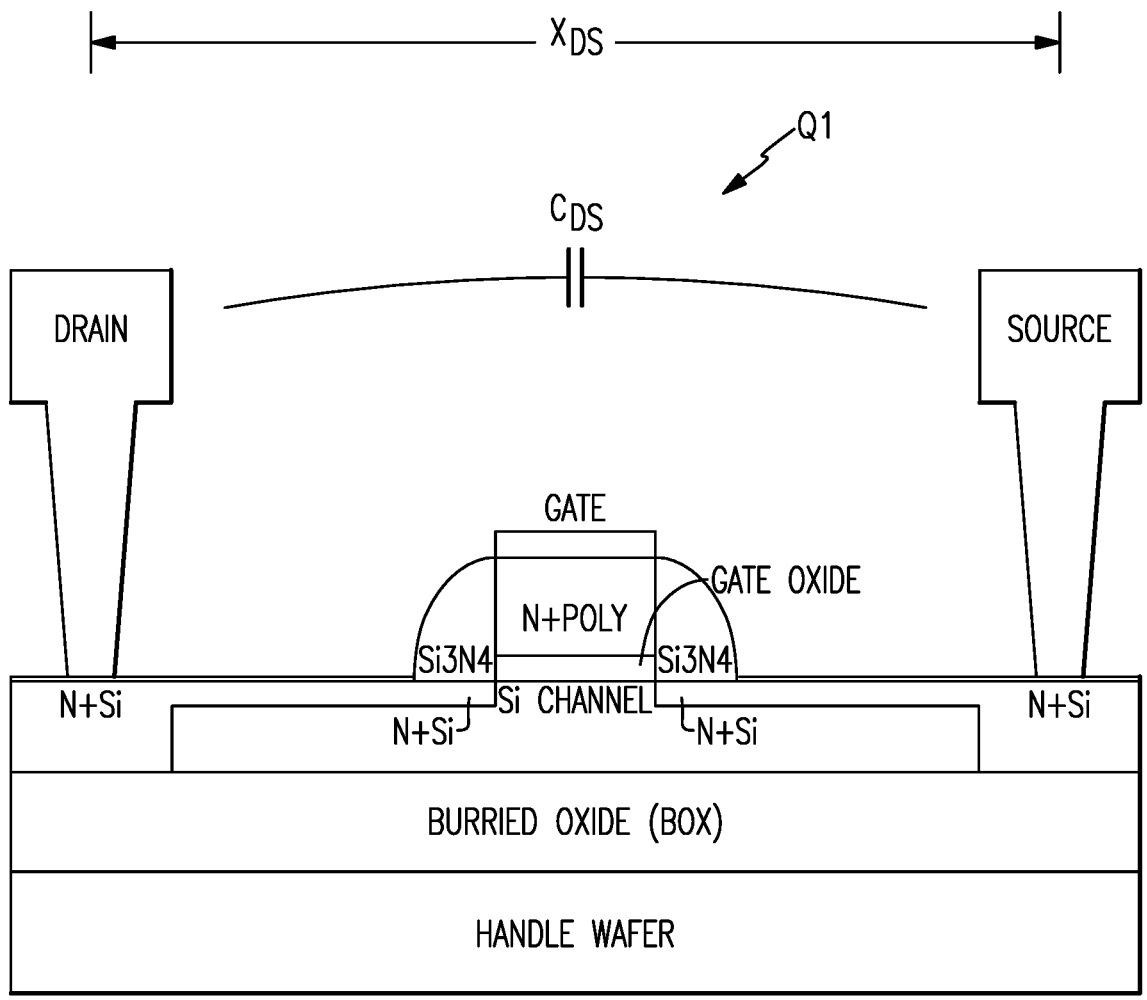
FIG. 20B shows a side view of an example FET transistor according to one or more embodiments.
Figure 20C:
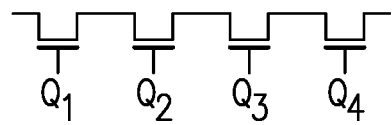
FIG. 20C shows a schematic depiction of the transistor stack of FIG. 20A according to one or more embodiments.

FIG. 20B shows a side view of an example FET transistor according to one or more embodiments. The transistor shown in FIG. 20B may be representative of the transistor $Q_1$ of FIG. 20A, for example. The diagram of FIG. 20B shows the capacitance present between the drain and source of the transistor $Q_1$, as described in greater detail above. FIG. 20C shows a schematic depiction of the transistor stack of FIG. 20A according to one or more embodiments, which shows the transistors $Q_1$-$Q_4$ connected in series.

For reasons discussed in detail above, it may be desirable for additional capacitance to be present from drain-to-source with respect to certain transistors in an RF transistor stack. Among possible ways in which such capacitance may be achieved, certain embodiments provide for adding capacitance to a transistor through the addition of metal to the various drain and/or source fingers of a transistor that may act as interdigitated drain-to-source capacitors.

Figure 21A:
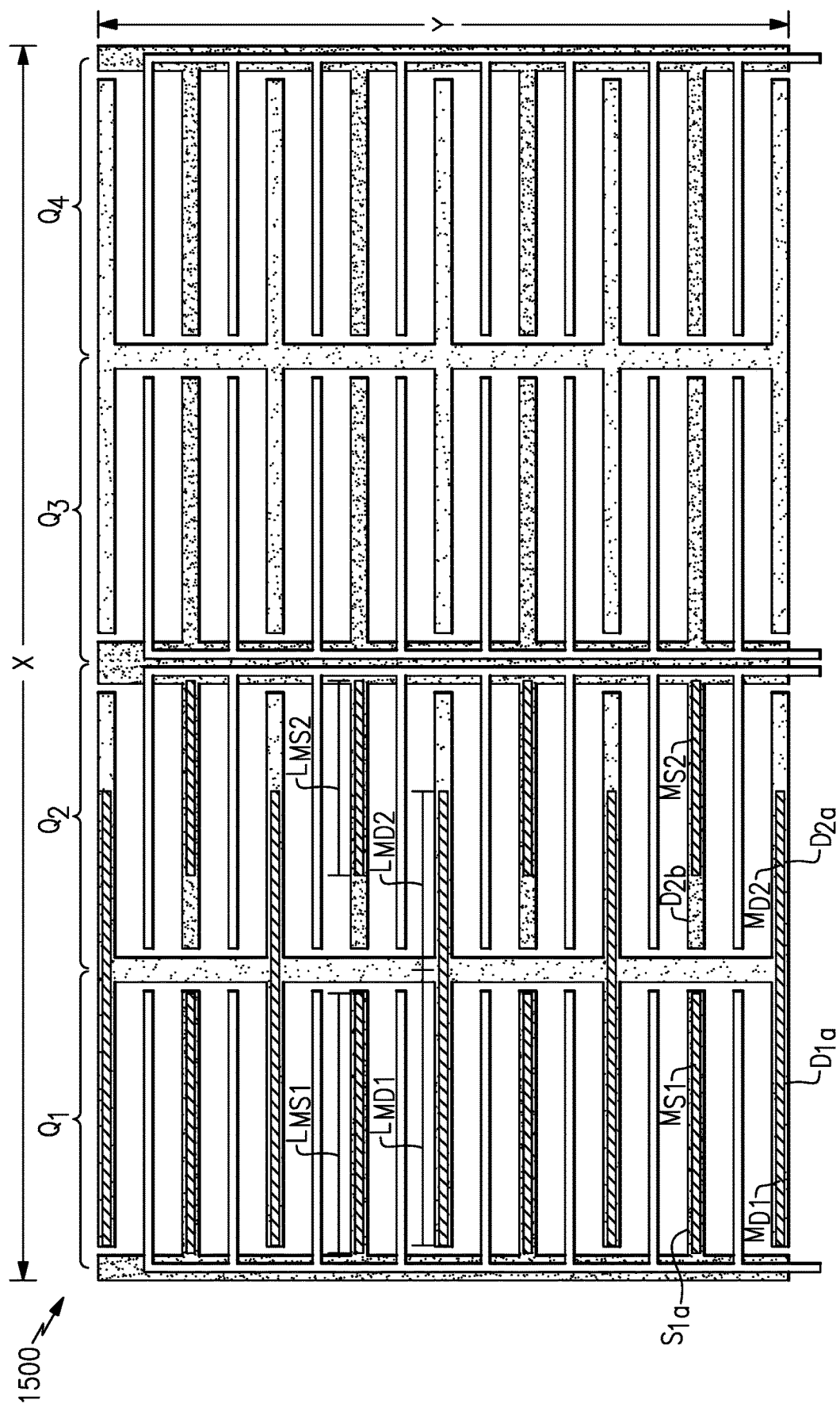
FIG. 21A shows a plan view of an example transistor stack according to one or more embodiments.

FIG. 21A shows a plan view of an example transistor stack according to one or more embodiments. The transistor stack 1500 may be similar in certain respects to the transistor stack 1400 shown in FIG. 20A. With respect to the transistor stack 1500, added capacitance for transistors $Q_1$ and/or $Q_2$ may be provided through the addition of metal traces on drain and/or source fingers. For example, transistor $Q_1$ includes a drain finger $D_{1a}$ that may have electrically coupled thereto a metal trace $M_{D1}$, and a source finger $S_{1a}$ that may have electrically coupled thereto a metal trace $M_{S1}$. The metal trace $M_{D1}$ may have a length $L_{MD1}$, which may substantially span the entire length of the drain finger, or a portion thereof. The metal trace MS1 may further have a length $L_{MS1}$, which may likewise span the entire length of the source finger, or merely a portion thereof. The length and/or thickness of the various metal traces may affect the amount of capacitance contributed by the traces. The metal traces may comprise a stack of metal on top of the respective fingers. In certain embodiments, a stack of metal may already exist on the wafer, and so implementing the metal traces of FIG. 21A may merely involve patterning such metal.

In certain embodiments, metal traces (e.g., $M_{D2}$, $M_{S2}$) may be associated with the respective drain and/or source fingers of one or more additional transistors of the stack 1500, such as with the adjacent transistor $Q_2$. In certain embodiments, the desired capacitance added to the subsequent transistor $Q_2$ may be less than the capacitance that is desirable for $Q_1$. Therefore, the length of the metal trace(s) $L_{MD2}$ associated with the drain $D_{2b}$ of $Q_2$ may be less than the length of the corresponding traces of $Q_1$, and/or the length of the metal trace(s) $L_{MS2}$ associated with the source $S_{2b}$ of $Q_2$ may be less than the length of the corresponding traces of $Q_2$.

Figure 21B:
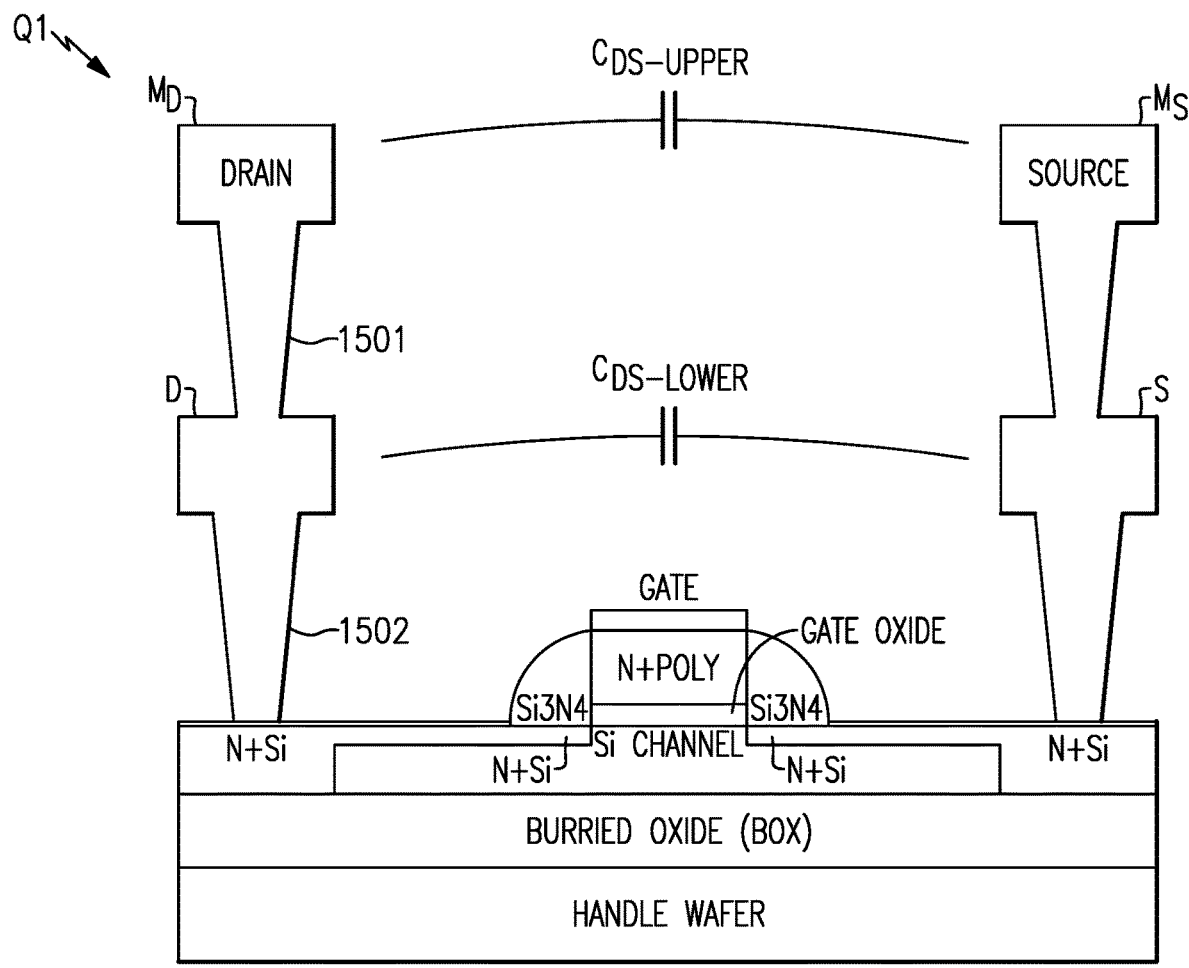
FIG. 21B shows a side view of an example FET transistor according to one or more embodiments.

FIG. 21B shows a side view of an example FET transistor according to one or more embodiments. The transistor $Q_1$ of FIG. 21B includes metal traces $M_D$ and $M_S$ coupled to the drain D and source S, respectively. The metal includes vertical via portions 1501, 1502 which may electrically couple metal between dielectric layers of the device. The capacitance added by the additional metal traces MD, MS is represented by the capacitor $C_{DS\text{-}UPPER}$, while the drain-to-source capacitance from the first layer of interconnect metal is represented by $C_{DS\text{-}LOWER}$.

Figure 21C:
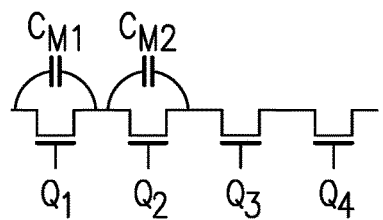
FIG. 21C shows a schematic depiction of the transistor stack of FIG. 21A according to one or more embodiments.

FIG. 21C shows a schematic depiction of the transistor stack of FIG. 21A according to one or more embodiments. The capacitors $C_{M1}$, $C_{M2}$ represent the added capacitance provided by the additional metal traces. In addition to the additional metal traces described in connection with FIGS. 21A-21C, added drain-to-source capacitance may be achieved using various other mechanisms as well. For example, in certain embodiments, drain and/or source metals may be widened, thereby bringing the drain and source relatively closer together, which may increase drain-to-source capacitance. However, similarly to the metal trace solution, such solution may generally be applied on a transistor (e.g., FET) stack where all transistors have similar, or uniform, drain-to-source spacing. Certain embodiments disclosed herein may achieve added capacitance through non-uniform drain-to-source spacing as an alternative to other capacitance adding techniques, or in addition thereto.

Figure 22A:
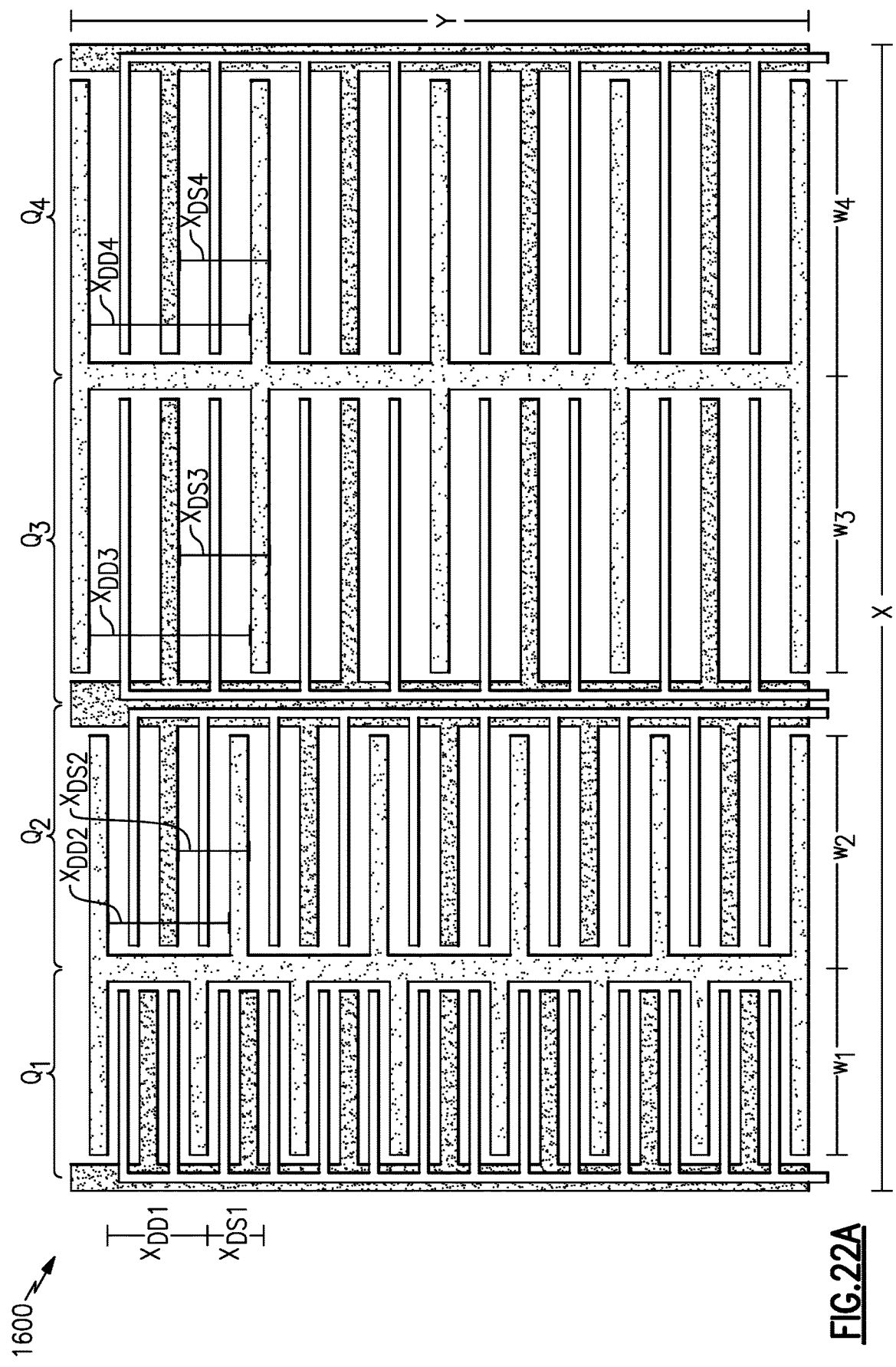
FIG. 22A shows a plan view of an example transistor stack according to one or more embodiments.

FIG. 22A shows a plan view of an example transistor stack 1600 according to one or more embodiments. The transistor stack 1600 may include non-uniform, or variable, drain-to-source (and/or gate-to-gate) spacing, as referenced above. In certain embodiments, where the drain-to-source capacitance for a selected transistor (e.g., $Q_1$) of a transistor stack is desired to be relatively high compared to one or more other transistors of the stack, such higher capacitance may be achieved through relative reduction of drain-to-source (and/or gate-to-gate) spacing as an alternative to, or in addition to, adding additional metal. Such a configuration may result in a stack of transistors where each of transistors, or subsets of transistors, have different drain-to-source (and/or gate-to-gate) spacing. In such embodiments, added capacitance may be achieved while simultaneously reducing size and/or loss.

Certain dimensions of the transistor stack 1600 and transistors thereof are shown. However, it should be understood that such dimensions are not necessarily drawn to scale and may have any desirable or suitable values and still fall within the scope of the present disclosure. In the embodiment of FIG. 22A, the total transistor peripheries may be similar to a transistor stack such as that shown in FIG. 20A and described above, wherein additional capacitance is achieved through reduced drain-to-source spacing and reduced size is also achieved due to the reduced spacing. That is, with the drain-to-source (and/or gate-to-gate) spacing of at least one of the transistors (e.g., $Q_1$) being reduced, more fingers may fit within the length Y of the transistor, and therefore, the same periphery may be achieved with a reduced unit gate width $w_1$, thereby reducing the overall footprint of the transistor $Q_1$ and/or transistor stack 1600.

Reducing the drain-to-source (and/or gate-to-gate) spacing, as shown for $Q_1$ relative to $Q3$ and $Q4$, may cause the existing metal layers to be brought closer to each other, thereby increasing capacitance and/or allowing for more fingers to fit within the width dimension Y, which may allow for a smaller unit gate width dimension $w_1$ relative to a unit gate width $w_2$ of the adjacent transistor $Q_2$ of the stack 1600. In addition, the unit gate width $w_2$ of the transistor $Q_2$ may be smaller than the next adjacent transistor $Q_3$ of the stack 1600. In certain embodiments, the unit gate width $w_3$ of the transistor $Q_3$ may be substantially equal to the unit gate width $w_4$ of the next adjacent transistor $Q_4$ of the stack 1600. That is, while some of the transistors may have relatively smaller unit gate widths, or graduated unit gate widths, multiple transistors farther down the stack may have similar unit gate widths. The smaller dimension $w_1$ can result in a smaller and/or cheaper die, as well as increased capacitance associated with one or more transistors. With the total transistor periphery maintained, the solution of FIG. 22A may further provide similar ON-resistance characteristics compared to certain larger device implementations.

In the embodiment of FIG. 22A, rather than adding features to certain transistors in a uniform stack of transistors to obtain variable capacitance, the geometry of the base transistor $Q_1$ and/or one or more additional transistors (e.g., $Q_2$) may be modified to provide certain additional side benefits, such as reduced size and/or reduced loss, in addition to the desired added non-uniform capacitance. In certain embodiments, the drain-to-source distance $X_{DS1}$ for a transistor (e.g., $Q_1$) of the stack 1600 may be reduced relative to the corresponding distance of one or more other transistors of the stack to approximately 0.76 μm, with a total drain-to-drain or source-to-source distance $X_{DD1}$ of approximately 1.52 μm. As explained above, references herein to drain-to-source spacing may further be representative of gate-to-gate spacing in certain embodiments.

The individual unit gate width $w_1$ of the transistor $Q_1$ may be approximately 14.0 μm in certain embodiments. In certain embodiments, the unit gate width $w_1$ associated with transistor $Q_1$ may be at least 5% shorter than that of one or more other transistors of the stack 1600. For example, the unit gate width $w_1$ of transistor $Q_1$ may be approximately 6.67% shorter than the unit gate width $w_4$ of transistor $Q_4$ and/or that of one or more other transistors (e.g., $Q_3$). The total gate width for the transistor $Q_1$ may be maintained at least in part by increasing the number of gate, drain and/or source fingers, such that the total dimension X of the stack and dimension $w_1$ of the transistor $Q_1$ are reduced, while the dimension Y of the stack may be substantially maintained in certain embodiments, thereby providing a reduced total area for the transistor $Q_1$ and/or transistor stack 1600.

In certain embodiments, the total number of gate fingers of the transistor $Q_1$ may be approximately 143, which may be more than that associated with another of the transistors of the stack 1600, such as transistor $Q_4$, which may have approximately 133 total gate fingers, for example.

With further reference to FIG. 22A, The total gate width, or periphery, of the transistor Q1 may be approximately 2000 μm according to certain embodiments, which may be based on a drain-to-source length $X_{DS1}$ of approximately 0.76, or less. In certain embodiments, the drain-to-source length $X_{DS1}$ is between approximately 0.76-0.84. In certain embodiments, the drain-to-source length $X_{DS1}$ of the transistor Q1 is at least approximately 8% less than the drain-to-source length (e.g., $X_{DS4}$) associated with another transistor (e.g., $Q_4$) of the stack 1600. In certain embodiments, the drain-to-source length $X_{DS1}$ of the transistor $Q_1$ is at least approximately 9% less than the drain-to-source length (e.g., $X_{DS4}$) associated with another transistor (e.g., $Q_4$) of the stack 1600. For example, the drain-to-source length $X_{DS1}$ of the transistor $Q_1$ may be at least approximately 10% less than the drain-to-source length (e.g., $X_{DS4}$) associated with another transistor (e.g., $Q_4$) of the stack 1600.

According to the example dimensions presented immediately above, the transistor $Q_1$ may have an ON-resistance of approximately 0.35 Ohm, which may represent substantially no reduction or increase in ON-resistance with respect to certain other transistors (e.g., $Q_4$) of the transistor stack 1600, or compared to a transistor of certain other transistor stacks having uniform drain-to-source spacing. The transistor $Q_1$ may have an OFF-capacitance of approximately 338 fF, which may represent a capacitance approximately 10% greater than one or more other transistors (e.g., $Q_4$) of the stack 1600 or compared to a transistor of certain other transistor stacks having uniform drain-to-source spacing. Therefore, the combination of ON-resistance and OFF-capacitance may be represented by Ron*Coff (fs)≈118. In certain embodiments, the transistor $Q_1$ may have an area of approximately 2313 μm², which may represent a reduction in transistor area of approximately 7% compared to one or more other transistors (e.g., $Q_4$) of the stack 1600 or compared to a transistor of certain other transistor stacks having uniform drain-to-source spacing.

With further reference to FIG. 22A, the drain-to-source (and/or gate-to-gate) spacing $X_{DS2}$ of the adjacent transistor $Q_2$ may be greater than that of transistor $Q_1$, but may still represent a reduced drain-to-source spacing with respect to one or more other transistors (e.g., $Q_3$ and/or $Q_4$) of the stack 1600. The gate length $w_2$ of the transistor $Q_2$ may be greater than the gate length $w_1$ of transistor $Q_1$, but less than the gate length $w_3$, $w_4$ of one or more other transistors (e.g., $Q_3$, $Q_4$) of the stack 1600. In certain embodiments, the drain-to-source spacing $X_{DS3}$ of the transistor $Q_3$ may be substantially equal to the drain-to-source spacing $X_{DS4}$ of the next adjacent transistor $Q_4$ of the stack 1600. That is, while some of the transistors may have relatively smaller drain-to-source spacing, or graduated drain-to-source spacing, multiple transistors farther down the stack may have similar drain-to-source spacing.

The relative and/or actual dimensions shown in FIG. 22A and described above may be fabricated using a patterned mask having a form designed to produce the various features and/or dimensions disclosed.

Figure 22B:
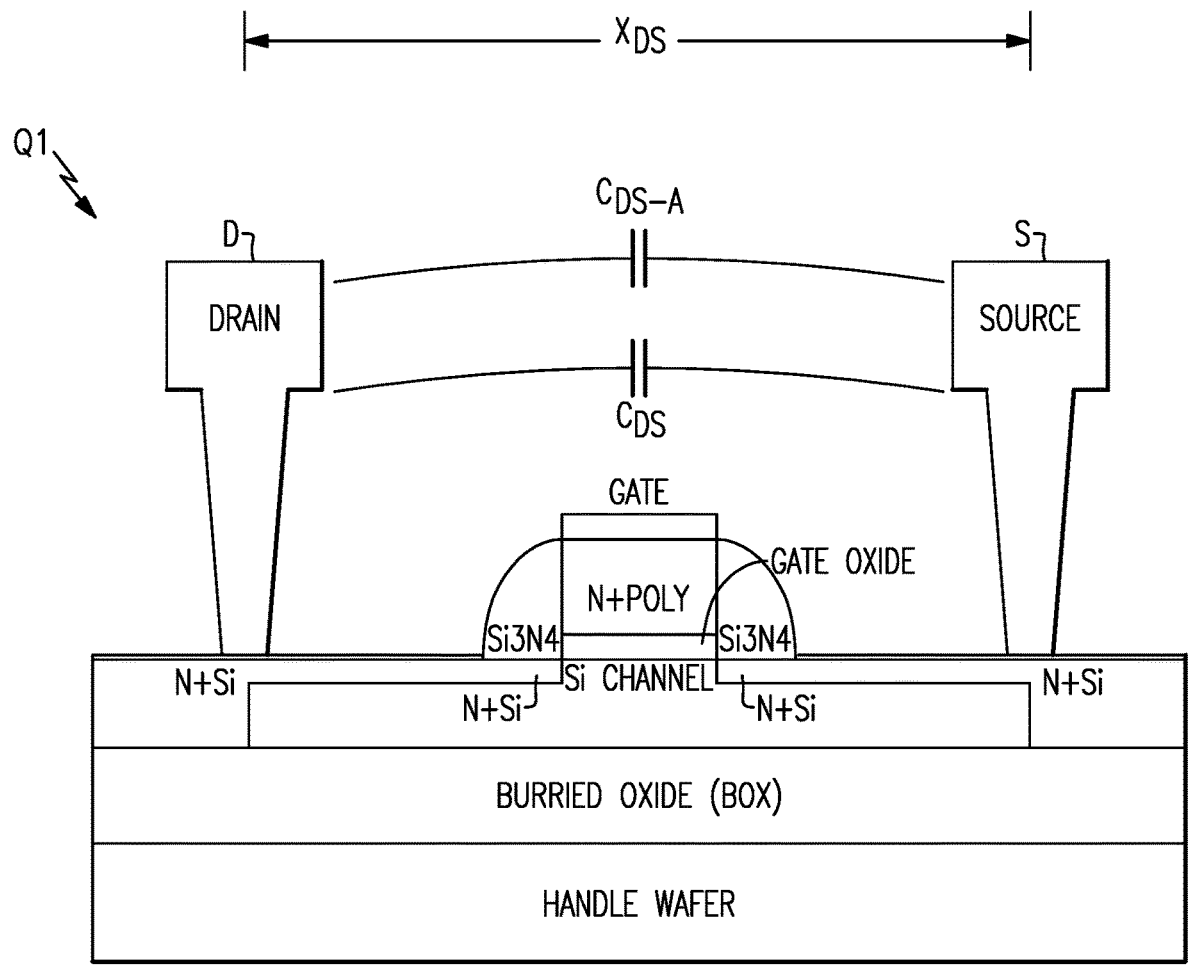
FIG. 22B shows a side view of an example FET transistor according to one or more embodiments.

FIG. 22B shows a side view of an example FET transistor $Q_1$ according to one or more embodiments. The transistor $Q_1$ of FIG. 21B may correspond to a transistor having reduced relative unit gate width and/or drain-to-source spacing as shown in FIG. 22A. The capacitance added by virtue of the reduced drain-to-source spacing is represented by the capacitor $C_{DS-A}$, while the original drain-to-source capacitance from the FET $Q_1$ of FIG. 20A is represented by $C_{DS}$.

Figure 22C:
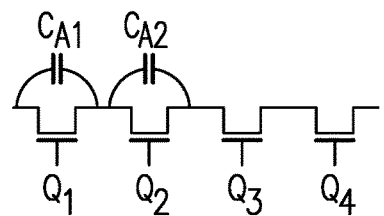
FIG. 22C shows a schematic depiction of the transistor stack of FIG. 22A according to one or more embodiments.

FIG. 22C shows a schematic depiction of the transistor stack of FIG. 22A according to one or more embodiments. The capacitors $C_{A1}$, $C_{A2}$ represent the added capacitance provided by reduced unit gate width and/or drain-to-source spacing.

Figure 23:
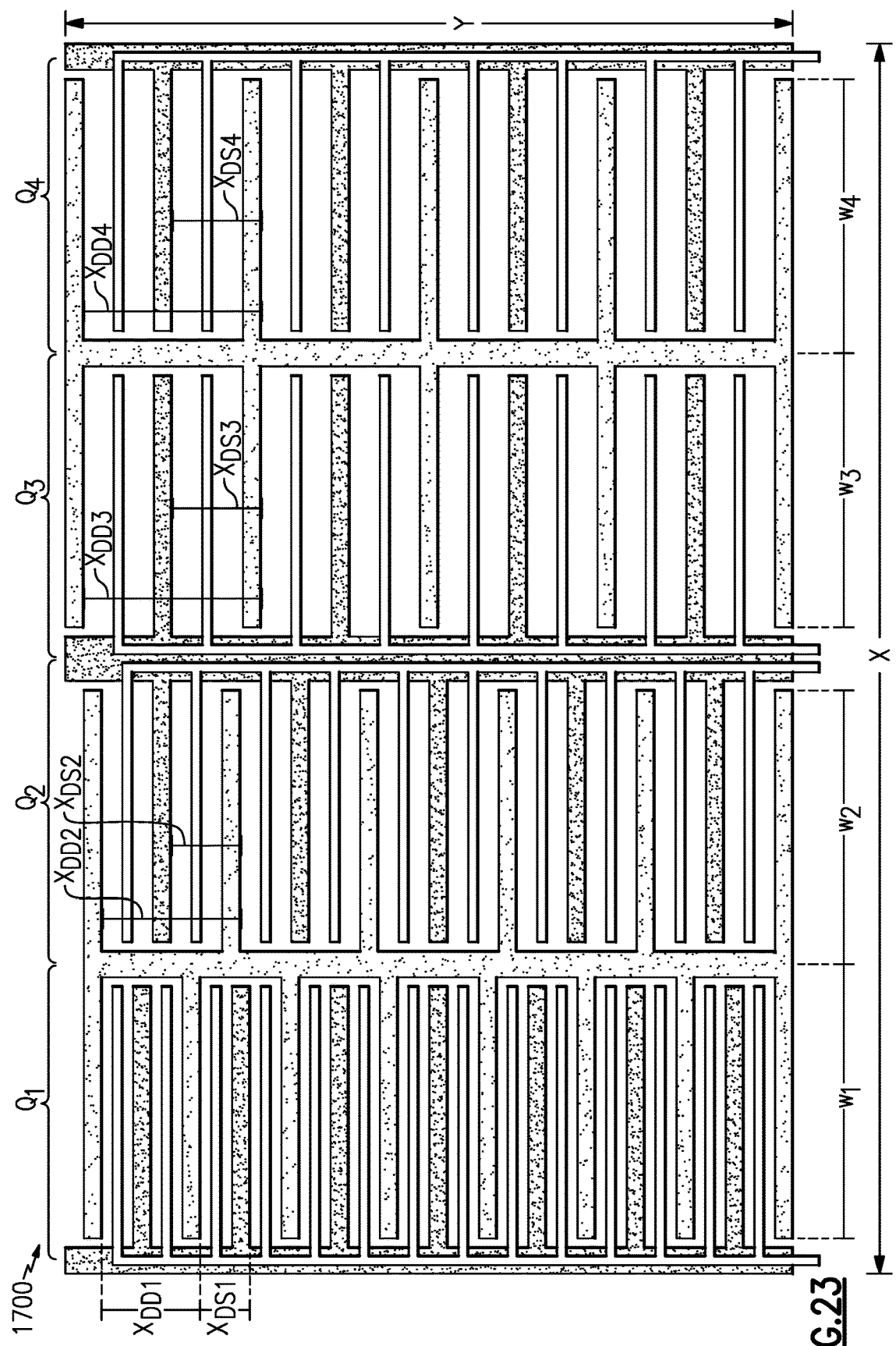
FIG. 23 shows a plan view of an example transistor stack according to one or more embodiments.

FIG. 23 shows a plan view of an example transistor stack 1700 according to one or more embodiments. Certain dimensions of the transistor stack 1400 and transistors thereof are shown. However, it should be understood that such dimensions are not necessarily drawn to scale and may have any desirable or suitable values and still fall within the scope of the present disclosure. The transistor $Q_1$ of the stack 1700 may differ from the transistor $Q_1$ of the stack 1600 of FIG. 22A in that the transistor $Q_1$ of FIG. 23 may not have relatively reduce unit gate width $w_1$ compared to other transistors (e.g., $Q_4$) of the stack 1700. However, the transistor $Q_1$ of FIG. 23 includes reduced relative drain-to-source spacing $X_{DS1}$. Such a configuration may provide increased total transistor periphery, which may result in reduced ON-resistance and/or reduced loss, while substantially maintaining transistor size. The reduced drain-to-source spacing may increase the capacitance of transistor $Q_1$ with respect to other transistors in the stack 1700 that have greater drain-to-source spacing. As explained above, references herein to drain-to-source spacing may further be representative of gate-to-gate spacing in certain embodiments.

Due to the reduced drain-to-source (and/or gate-to-gate) spacing the transistor $Q_1$ may be able to accommodate an increased number of gate, source and/or drain fingers compared to one or more other transistors of the stack 1700, which provides a relatively greater periphery for the transistor $Q_1$, which may further lead to reduced ON-resistance and/or improved performance from an ON-resistance perspective. Furthermore, increased capacitance may be achieved without suffering from increased transistor/stack size compared to certain transistor stacks having uniform drain-to-source distance across transistors of a stack.

In one embodiment of FIG. 23, rather than adding features to certain transistors in a uniform stack of transistors to obtain variable capacitance, the geometry of the base transistor $Q_1$ and/or one or more additional transistors (e.g., $Q_2$) may be modified to provide certain additional side benefits, such as reduced loss, in addition to the desired added non-uniform capacitance. In certain embodiments, the drain-to-source (and/or gate-to-gate) distance $X_{DS1}$ for a transistor (e.g., $Q_1$) of the stack 1700 may be reduced relative to the corresponding distance of one or more other transistors of the stack to approximately 0.76 μm, with a total drain-to-drain or source-to-source distance $X_{DD1}$ of approximately 1.52 μm. The individual unit gate width $w_1$ of the transistor $Q_1$ may be approximately 15.1 μm in certain embodiments. The total gate width for the transistor $Q_1$ may be greater than that of one or more additional transistors (e.g., $Q_4$) of the stack 1700 due to the decreased drain-to-source (and/or gate-to-gate) spacing, which may allow for additional gate, source and/or drain fingers to be fit within the dimensions of the transistor. In certain embodiments, the total number of gate fingers of the transistor $Q_1$ may be approximately 143, which may be more than that associated with another of the transistors of the stack 1700, such as transistor $Q_4$, which may have approximately 133 total gate fingers, for example.

With further reference to FIG. 23, in one embodiment, the total gate width, or periphery, of the transistor $Q_1$ may be approximately 2159 μm according to certain embodiments, which may be based on a drain-to-source $X_{DS1}$ length of approximately 0.76, or less. In certain embodiments, the drain-to-source length $X_{DS1}$ is between approximately 0.76-0.84. In certain embodiments, the drain-to-source length $X_{DS1}$ of the transistor $Q_1$ is at least approximately 8% less than the drain-to-source length (e.g., $X_{DS4}$) associated with another transistor (e.g., $Q_4$) of the stack 1700. In certain embodiments, the drain-to-source length $X_{DS1}$ of the transistor $Q_1$ is at least approximately 9% less than the drain-to-source length (e.g., $X_{DS4}$) associated with another transistor (e.g., $Q_4$) of the stack 1700. For example, the drain-to-source length $X_{DS1}$ of the transistor $Q_1$ may be at least approximately 10% less than the drain-to-source length (e.g., $X_{DS4}$) associated with another transistor (e.g., $Q_4$) of the stack 1700.

With further reference to FIG. 23, according to the example dimensions presented immediately above, the transistor $Q_1$ may have an ON-resistance of approximately 0.32 Ohm, which may represent a reduction of approximately 8% or more with respect to certain other transistors (e.g., $Q_4$) of the transistor stack 1700, or compared to a transistor of certain other transistor stacks having uniform drain-to-source spacing. The transistor $Q_1$ may have an OFF-capacitance of approximately 365 fF, which may represent a capacitance approximately 19% greater than one or more other transistors (e.g., $Q_4$) of the stack 1700 or compared to a transistor of certain other transistor stacks having uniform drain-to-source spacing. The combination of ON-resistance and OFF-capacitance may be represented by Ron*Coff (fs)≈118. In certain embodiments, the transistor $Q_1$ may have an area of approximately 2474 μm$^2$, which may represent a substantially uniform transistor area compared to one or more other transistors (e.g., 04) of the stack 1700 or compared to a transistor of certain other transistor stacks having uniform drain-to-source spacing. With further reference to FIG. 23, The drain-to-source (and/or gate-to-gate) spacing $X_{DS2}$ may be greater than that of transistor $Q_1$, but may still represent a reduced drain-to-source spacing with respect to one or more other transistors (e.g., $Q_3$ and/or $Q_4$) of the stack 1700.

In another embodiment of the transistor stack 1700 FIG. 23, the drain-to-source distance $X_{DS1}$ for a transistor (e.g., $Q_1$) of the stack 1700 may be reduced relative to the corresponding distance of one or more other transistors of the stack to approximately 0.8 μm, with a total drain-to-drain or source-to-source distance $X_{DD1}$ of approximately 1.6 μm. The individual unit gate width $W_1$ of the transistor $Q_1$ may be approximately 15.1 μm in certain embodiments. The total gate width for the transistor $Q_1$ may be greater than that of one or more additional transistors (e.g., $Q_4$) of the stack 1700 due to the decreased drain-to-source (and/or gate-to-gate) spacing, which may allow for additional gate, source and/or drain fingers to be fit within the dimensions of the transistor. In certain embodiments, the total number of gate fingers of the transistor $Q_1$ may be approximately 137, which may be more than that associated with another of the transistors of the stack 1700, such as transistor $Q_4$, which may have approximately 133 total gate fingers, for example.

With further reference to FIG. 23, in one embodiment, the total gate width, or periphery, of the transistor Q1 may be approximately 2069 μm according to certain embodiments, which may be based on a drain-to-source length $X_{DS1}$ of approximately 0.8, or less. In certain embodiments, the drain-to-source length $X_{DS1}$ is between approximately 0.80-0.84. In certain embodiments, the drain-to-source (and/or gate-to-gate) length $X_{DS1}$ of the transistor $Q_1$ is at least approximately 4% less than the drain-to-source (and/or gate-to-gate) length (e.g., $X_{DS4}$) associated with another transistor (e.g., $Q_4$) of the stack 1700. In certain embodiments, the drain-to-source (and/or gate-to-gate) length $X_{DS1}$ of the transistor $Q_1$ is at least approximately 4.7% less than the drain-to-source (and/or gate-to-gate) length (e.g., $X_{DS4}$) associated with another transistor (e.g., $Q_4$) of the stack 1700.

With further reference to FIG. 23, according to the example dimensions presented immediately above, the transistor $Q_1$ may have an ON-resistance of approximately 0.34 Ohm, which may represent a reduction of approximately 3% or more with respect to certain other transistors (e.g., $Q_4$) of the transistor stack 1700, or compared to a transistor of certain other transistor stacks having uniform drain-to-source spacing. The transistor $Q_1$ may have an OFF-capacitance of approximately 332 fF, which may represent a capacitance approximately 8% greater than one or more other transistors (e.g., $Q_4$) of the stack 1700 or compared to a transistor of certain other transistor stacks having uniform drain-to-source spacing. The combination of ON-resistance and OFF-capacitance may be represented by Ron*Coff (fs)≈113. In certain embodiments, the transistor $Q_1$ may have an area of approximately 2464 μm², which may represent a substantially uniform transistor area compared to one or more other transistors (e.g., $Q_4$) of the stack 1700 or compared to a transistor of certain other transistor stacks having uniform drain-to-source spacing. With further reference to FIG. 23, The drain-to-source spacing $X_{DS2}$ may be greater than that of transistor $Q_1$, but may still represent a reduced drain-to-source spacing with respect to one or more other transistors (e.g., $Q_3$ and/or $Q_4$) of the stack 1700. In certain embodiments, the drain-to-source spacing $X_{DS3}$ of the transistor $Q_3$ may be substantially equal to the drain-to-source spacing $X_{DS4}$ of the next adjacent transistor $Q_4$ of the stack 1700. That is, while some of the transistors may have relatively smaller drain-to-source spacing, or graduated drain-to-source spacing, multiple transistors farther down the stack may have similar drain-to-source spacing.

The relative and/or actual dimensions shown in FIG. 23 and described above may be fabricated using a patterned mask having a form designed to produce the various features and/or dimensions disclosed.

Examples Related to Switch Configurations

As described herein in reference to the examples of FIGS. 13-17, FET devices having one or more features of the present disclosure can be utilized to implement an SPDT switch configuration. It will be understood that FET devices having one or more features of the present disclosure can also be implemented in other switch configurations.

Figure 24:
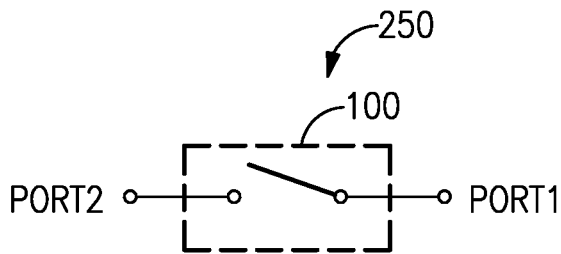
FIG. 24 shows a switch assembly implemented in a single-pole-single-throw (SPST) configuration utilizing an SOI FET device.

FIGS. 24-34 show examples related to various switch configurations that can be implemented utilizing FET devices such as SOI FET devices having one or more features as described herein. For example, FIG. 24 shows a switch assembly 250 implemented in a single-pole-single-throw (SPST) configuration. Such a switch can include an SOI FET device 100 implemented between a first port (Port1) and a second port (Port2).

Figure 25:
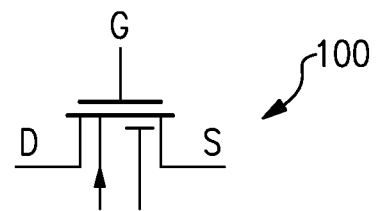
FIG. 25 shows that in some embodiments, the SOI FET device of FIG. 24 can include a substrate biasing/coupling feature as described herein.

FIG. 25 shows that in some embodiments, the SOI FET device 100 of FIG. 24 can include a substrate biasing/coupling feature as described herein. The source node of the SOI FET device 100 can be connected to the first port (Port1), and the drain node of the SOI FET device 100 can be connected to the second port (Port2). As described herein, the SOI FET device 100 can be turned ON to close the switch 250 (of FIG. 24) between the two ports, and turned OFF to open the switch 250 between the two ports.

It will be understood that the SOI FET device 100 of FIGS. 24 and 25 can include a single FET, or a plurality of FETs arranged in a stack. It will also be understood that each of various SOI FET devices 100 of FIGS. 26-34 can include a single FET, or a plurality of FETs arranged in a stack.

Figure 26:
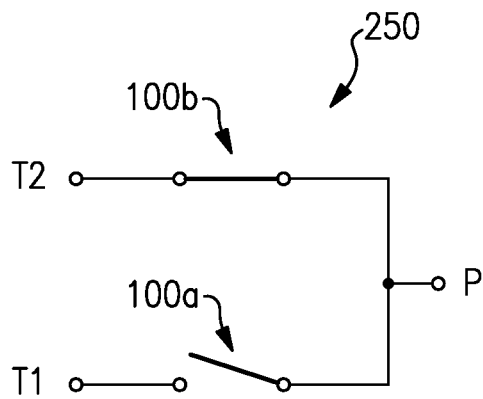
FIG. 26 shows an example of how two SPST switches having one or more features as described herein can be utilized to form a switch assembly having a single-pole-double-throw (SPDT) configuration.
Figure 27:
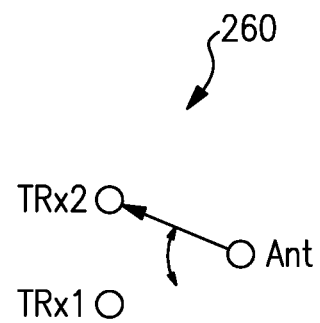
FIG. 27 shows that the switch assembly of FIG. 26 can be utilized in an antenna switch configuration.

FIG. 26 shows an example of how two SPST switches (e.g., similar to the examples of FIGS. 24, 25) having one or more features as described herein can be utilized to form a switch assembly 250 having a single-pole-double-throw (SPDT) configuration. FIG. 27 shows, in a SPDT representation, that the switch assembly 250 of FIG. 26 can be utilized in an antenna switch configuration 260. It will be understood that one or more features of the present disclosure can also be utilized in switching applications other than antenna switching application.

It is noted that in various switching configuration examples of FIGS. 24-34, switchable shunt paths are not shown for simplified views of the switching configurations. Accordingly, it will be understood that some or all of switchable paths in such switching configurations may or may not have associated with them switchable shunt paths.

Referring to the examples of FIGS. 26 and 27, it is noted that such examples may be similar to the examples described herein in reference to FIGS. 13-15. In some embodiments, the single pole (P) of the switch assembly 250 of FIG. 26 can be utilized as an antenna node (Ant) of the antenna switch 260, and the first and second throws (T1, T2) of the switch assembly 250 of FIG. 26 can be utilized as TRx1 and TRx2 nodes, respectively, of the antenna switch 260. Although each of the TRx1 and TRx2 nodes is indicated as providing transmit (Tx) and receive (Rx) functionalities, it will be understood that each of such nodes can be configured to provide either or both of such Tx and Rx functionalities.

In the examples of FIGS. 26 and 27, the SPDT functionality is shown to be provided by two SPST switches 100a, 100b, with the first SPST switch 100a providing a first switchable path between the pole P (Ant in FIG. 27) and the first throw T1 (TRx1 in FIG. 27), and the second SPST switch 100b providing a second switchable path between the pole P (Ant in FIG. 27) and the second throw T2 (TRx2 in FIG. 27). Accordingly, selective coupling of the pole (Ant) with either of the first throw T1 (TRx1) and the second throw T2 (TRx2) can be achieved by selective switching operations of the first and second SPST switches. For example, if a connection is desired between the pole (Ant) and the first throw T1 (TRx1), the first SPST switch 100a can be closed, and the second SPST switch 100b can be opened. Similarly, and as depicted in the example state in FIGS. 26 and 27, if a connection is desired between the pole (Ant) and the second throw T2 (TRx2), the first SPST switch 100a can be opened, and the second SPST switch 100b can be closed.

In the foregoing switching examples of FIGS. 26 and 27, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Figure 28:
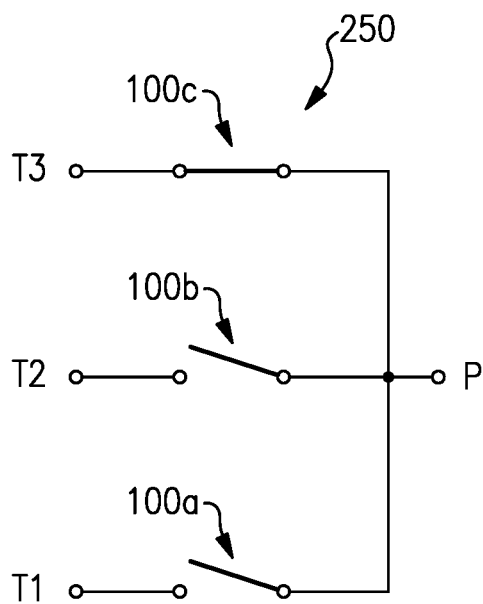
FIG. 28 shows an example of how three SPST switches having one or more features as described herein can be utilized to form a switch assembly having a single-pole-triple-throw (SP3T) configuration.
Figure 29:
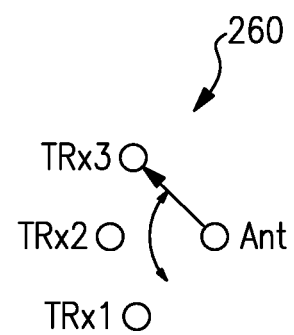
FIG. 29 shows that the switch assembly of FIG. 28 can be utilized in an antenna switch configuration.

FIG. 28 shows an example of how three SPST switches (e.g., similar to the examples of FIGS. 24, 25) having one or more features as described herein can be utilized to form a switch assembly 250 having a single-pole-triple-throw (SP3T) configuration. FIG. 29 shows, in a SP3T representation, that the switch assembly 250 of FIG. 29 can be utilized in an antenna switch configuration 260. It will be understood that one or more features of the present disclosure can also be utilized in switching applications other than antenna switching application.

Referring to the examples of FIGS. 28 and 29, it is noted that the SP3T configuration can be an extension of the SPDT configuration of FIGS. 26 and 27. For example, the single pole (P) of the switch assembly 250 of FIG. 28 can be utilized as an antenna node (Ant) of the antenna switch 260, and the first, second and third throws (T1, T2, T3) of the switch assembly 250 of FIG. 28 can be utilized as TRx1, TRx2 and TRx3 nodes, respectively, of the antenna switch 260. Although each of the TRx1, TRx2 and TRx3 nodes is indicated as providing transmit (Tx) and receive (Rx) functionalities, it will be understood that each of such nodes can be configured to provide either or both of such Tx and Rx functionalities.

In the examples of FIGS. 28 and 29, the SP3T functionality is shown to be provided by three SPST switches 100a, 100b, 100c, with the first SPST switch 100a providing a first switchable path between the pole P (Ant in FIG. 29) and the first throw T1 (TRx1 in FIG. 29), the second SPST switch 100b providing a second switchable path between the pole P (Ant in FIG. 29) and the second throw T2 (TRx2 in FIG. 29), and the third SPST switch 100c providing a third switchable path between the pole P (Ant in FIG. 29) and the third throw T3 (TRx3 in FIG. 29). Accordingly, selective coupling of the pole (Ant) with one of the first throw T1 (TRx1), the second throw T2 (TRx2), and the third throw T3 (TRx3) can be achieved by selective switching operations of the first, second and third SPST switches. For example, if a connection is desired between the pole (Ant) and the first throw T1 (TRx1), the first SPST switch 100a can be closed, and each of the second and third SPST switches 100b, 100c can be opened. If a connection is desired between the pole (Ant) and the second throw T2 (TRx2), the second SPST switch 100b can be closed, and each of the first and third SPST switches 100a, 100c can be opened. Similarly, and as depicted in the example state in FIGS. 28 and 29, if a connection is desired between the pole (Ant) and the third throw T3 (TRx3), each of the first and second SPST switches 100a, 100b can be opened, and the third SPST switch 100c can be closed.

In the foregoing switching examples of FIGS. 28 and 29, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Based on the foregoing examples of SPST, SPDT and SP3T configurations of FIGS. 24-29, one can see that other switching configurations involving a single pole (SP) can be implemented utilizing SOI FET devices having one or more features as described herein. Thus, it will be understood that a switch having a SPNT can be implemented utilizing one or more SOI FET devices as described herein, where the quantity N is a positive integer.

Figure 30:
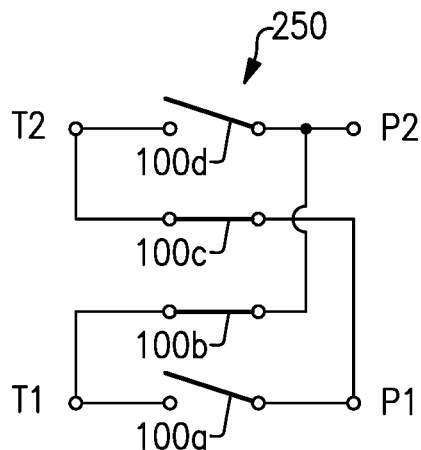
FIG. 30 shows an example of how four SPST switches having one or more features as described herein can be utilized to form a switch assembly having a double-pole-double-throw (DPDT) configuration.
Figure 31:
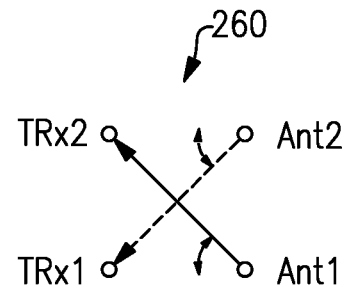
FIG. 31 shows that the switch assembly of FIG. 30 can be utilized in an antenna switch configuration.
Figure 32:
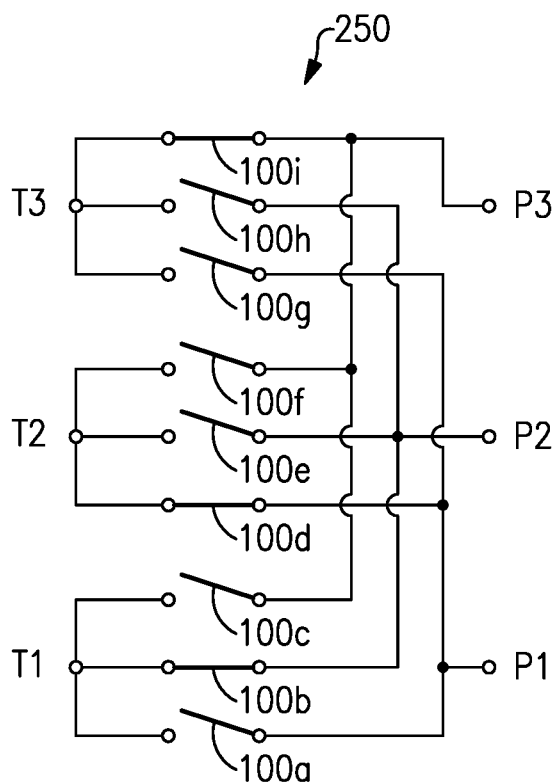
FIG. 32 shows an example of how nine SPST switches having one or more features as described herein can be utilized to form a switch assembly having a 3-pole-3-throw (3P3T) configuration.
Figure 33:
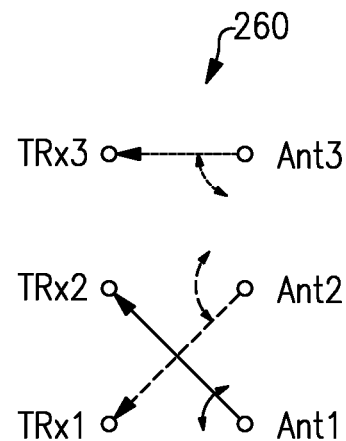
FIG. 33 shows that the switch assembly of FIG. 32 can be utilized in an antenna switch configuration.

Switching configurations of FIGS. 26-29 are examples where a single pole (SP) is connectable to one or more of a plurality of throws to provide the foregoing SPNT functionality. FIGS. 30-33 show examples where more than one poles can be provided in switching configurations. FIGS. 30 and 31 show examples related to a double-pole-double-throw (DPDT) switching configuration that can utilize a plurality of SOI FET devices having one or more features as described herein. Similarly, FIGS. 32 and 33 show examples related to a triple-pole-triple-throw (3P3T) switching configuration that can utilize a plurality of SOI FET devices having one or more features as described herein.

It will be understood that a switching configuration utilizing a plurality of SOI FET devices having one or more features as described herein can include more than three poles. Further, it is noted that in the examples of FIGS. 30-33, the number of throws (e.g., 2 in FIGS. 30 and 31, and 3 in FIGS. 32 and 33) are depicted as being the same as the corresponding number of poles for convenience. However, it will be understood that the number of throws may be different than the number of poles.

FIG. 30 shows an example of how four SPST switches (e.g., similar to the examples of FIGS. 24, 25) having one or more features as described herein can be utilized to form a switch assembly 250 having a DPDT configuration. FIG. 31 shows, in a DPDT representation, that the switch assembly 250 of FIG. 30 can be utilized in an antenna switch configuration 260. It will be understood that one or more features of the present disclosure can also be utilized in switching applications other than antenna switching application.

In the examples of FIGS. 30 and 31, the DPDT functionality is shown to be provided by four SPST switches 100a, 100b, 100c, 100d. The first SPST switch 100a is shown to provide a switchable path between a first pole P1 (Ant1 in FIG. 31) and a first throw T1 (TRx1 in FIG. 31), the second SPST switch 100b is shown to provide a switchable path between a second pole P2 (Ant2 in FIG. 31) and the first throw T1 (TRx1 in FIG. 31), the third SPST switch 100c is shown to provide a switchable path between the first pole P1 (Ant1 in FIG. 31) and a second throw T2 (TRx2 in FIG. 31), and the fourth SPST switch 100d is shown to provide a switchable path between the second pole P2 (Ant2 in FIG. 31) and the second throw T2 (TRx2 in FIG. 31). Accordingly, selective coupling between one or more of the poles (antenna nodes) with one or more of the throws (TRx nodes) can be achieved by selective switching operations of the four SPST switches 100a, 100b, 100c, 100d. Examples of such switching operations are described herein in greater detail.

FIG. 32 shows an example of how nine SPST switches (e.g., similar to the examples of FIGS. 24, 25) having one or more features as described herein can be utilized to form a switch assembly 250 having a 3P3T configuration. FIG. 33 shows, in a 3P3T representation, that the switch assembly 250 of FIG. 32 can be utilized in an antenna switch configuration 260. It will be understood that one or more features of the present disclosure can also be utilized in switching applications other than antenna switching application.

Referring to the examples of FIGS. 32 and 33, it is noted that the 3P3T configuration can be an extension of the DPDT configuration of FIGS. 30 and 31. For example, a third pole (P3) can be utilized as a third antenna node (Ant3), and a third throw (T3) can be utilized as a third TRx node (TRx3). Connectivity associated with such third pole and third throw can be implemented similar to the examples of FIGS. 30 and 31.

In the examples of FIGS. 32 and 33, the 3P3T functionality is shown to be provided by nine SPST switches 100a-100i. Such nine SPST switches can provide switchable paths as listed in Table 1.

TABLE 1

| SPST switch | Pole | Throw |
|---|---|---|
| 100a | P1 | T1 |
| 100b | P2 | T1 |
| 100c | P3 | T1 |
| 100d | P1 | T2 |
| 100e | P2 | T2 |
| 100f | P3 | T2 |
| 100g | P1 | T3 |
| 100h | P2 | T3 |
| 100i | P3 | T3 |

Based on the example of FIGS. 32 and 33, and Table 1, one can see that selective coupling between one or more of the poles (antenna nodes) with one or more of the throws (TRx nodes) can be achieved by selective switching operations of the nine SPST switches 100a-100i.

In many applications, switching configurations having a plurality of poles and a plurality of throws can provide increased flexibility in how RF signals can be routed therethrough. FIGS. 34A-34E show examples of how a DPDT switching configuration such as the examples of FIGS. 30 and 31 can be operated to provide different signal routing functionalities. It will be understood that similar control schemes can also be implemented for other switching configurations, such as the 3P3T examples of FIGS. 32 and 33.

In some wireless front-end architectures, two antennas can be provided, and such antennas can operate with two channels, with each channel being configured for either or both of Tx and Rx operations. For the purpose of description, it will be assumed that each channel is configured for both Tx and Rx operations (TRx). However, it will be understood that each channel does not necessarily need to have such TRx functionality. For example, one channel can be configured for TRx operations, while the other channel can be configured for Rx operation. Other configurations are also possible.

In the foregoing front-end architectures, there may be relatively simple switching states including a first state and a second state. In the first state, the first TRx channel (associated with the node TRx1) can operate with the first antenna (associated with the node Ant1), and the second TRx channel (associated with the node TRx2) can operate with the second antenna (associated with the node Ant2). In the second state, connections between the antenna nodes and the TRx nodes can be swapped from the first state. Accordingly, the first TRx channel (associated with the node TRx1) can operate with the second antenna (associated with the node Ant2), and the second TRx channel (associated with the node TRx2) can operate with the first antenna (associated with the node Ant1).

In some embodiments, such two states of the DPDT switching configuration can be controlled by a one-bit logic scheme, as shown in the example logic states in Table 2.

TABLE 2

| State | Control logic | TRx1-Ant1 connection | TRx1-Ant2 connection | TRx2-Ant1 connection | TRx2-Ant2 connection |
|---|---|---|---|---|---|
| 1 | 0 | Yes | No | No | Yes |
| 2 | 1 | No | Yes | Yes | No |

Figure 34A:
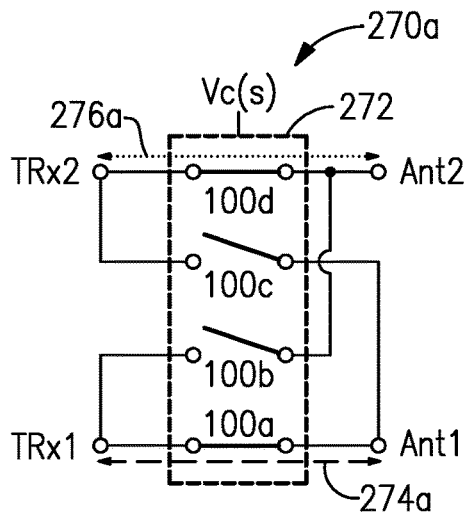
FIGS. 34A-34E show examples of how a DPDT switching configuration can be operated to provide different signal routing functionalities.
Figure 34B:
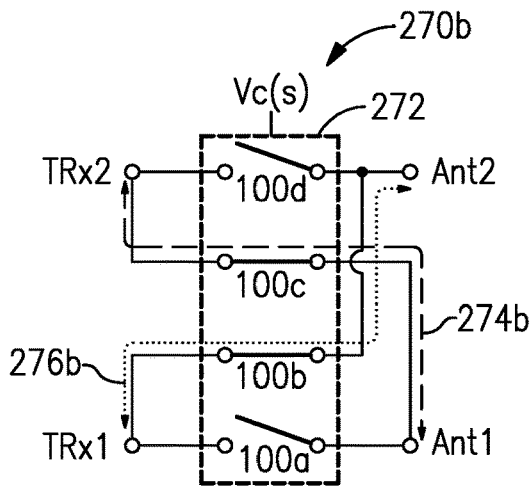

The first state (State 1) of the example of Table 2 is depicted in FIG. 34A as 270a, where the TRx1-Ant1 connection is indicated as path 274a, and the TRx2-Ant2 connection is indicated as path 276a. A control signal, representative of the control logic of Table 2, provided to the assembly (272) of the four SPST switches (100a, 100b, 100c, 100d) is collectively indicated as Vc(s). Similarly, the second state (State 2) of the example of Table 2 is depicted in FIG. 34B as 270b, where the TRx1-Ant2 connection is indicated as path 276b, and the TRx2-Ant1 connection is indicated as path 274b.

In some front-end architectures having a DPDT switching configuration, it may be desirable to have additional switching states. For example, it may be desirable to have only one path active among the two TRx channels and the two antennas. In another example, it may be desirable to disable all signal paths through the DPDT switch. Examples of 3-bit control logic that can be utilized to achieve such examples switching states are listed in Table 3.

TABLE 3

| State | Control logic (Vc1, Vc2, Vc3) | TRx1-Ant1 connection | TRx1-Ant2 connection | TRx2-Ant1 connection | TRx2-Ant2 connection |
|---|---|---|---|---|---|
| 1 | 0, 0, 0 | No | No | No | No |
| 2 | 0, 0, 1 | Yes | No | No | Yes |
| 3 | 0, 1, 0 | Yes | No | No | No |
| 4 | 0, 1, 1 | No | Yes | Yes | No |
| 5 | 1, 0, 0 | No | Yes | No | No |

Figure 34C:
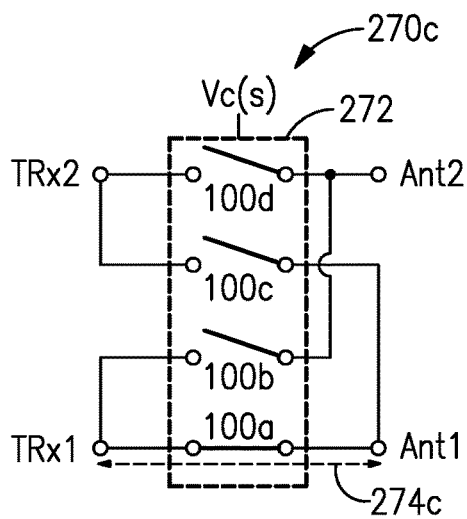
Figure 34D:
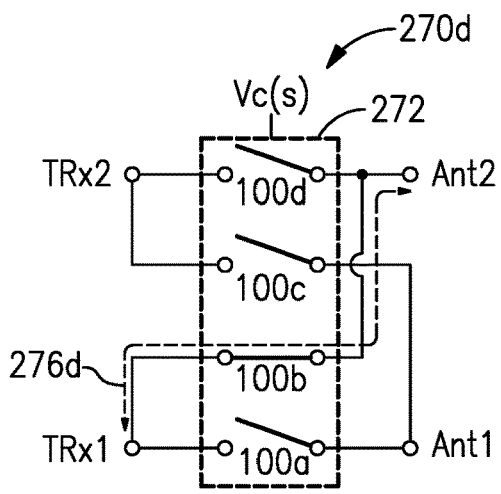
Figure 34E:
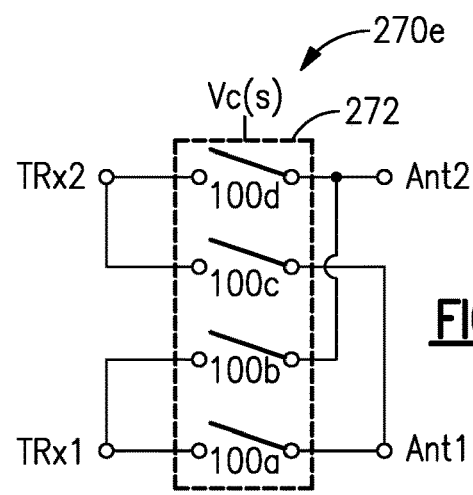

The first state (State 1) of the example of Table 3 is depicted in FIG. 34E as 270e, where all of the TRx-Ant paths are disconnected. A control signal indicated as Vc(s) in FIG. 34E and as listed in Table 3 can be provided to the assembly (272) of the four SPST switches (100a, 100b, 100c, 100d) to effectuate such a switching state.

The second state (State 2) of the example of Table 3 is depicted in FIG. 34A as 270a, where the TRx1-Ant1 connection is indicated as path 274a, and the TRx2-Ant2 connection is indicated as path 276a. A control signal indicated as Vc(s) in FIG. 34A and as listed in Table 3 can be provided to the assembly (272) of the four SPST switches (100a, 100b, 100c, 100d) to effectuate such a switching state.

The third state (State 3) of the example of Table 3 is depicted in FIG. 34C as 270c, where the TRx1-Ant1 connection is indicated as path 274c, and all other paths are disconnected. A control signal indicated as Vc(s) in FIG. 34C and as listed in Table 3 can be provided to the assembly (272) of the four SPST switches (100a, 100b, 100c, 100d) to effectuate such a switching state.

The fourth state (State 4) of the example of Table 3 is depicted in FIG. 34B as 270b, where the TRx1-Ant2 connection is indicated as path 276b, and the TRx2-Ant1 connection is indicated as path 274b. A control signal indicated as Vc(s) in FIG. 34B and as listed in Table 3 can be provided to the assembly (272) of the four SPST switches (100a, 100b, 100c, 100d) to effectuate such a switching state.

The fifth state (State 5) of the example of Table 3 is depicted in FIG. 34D as 270d, where the TRx1-Ant2 connection is indicated as path 276d, and all other paths are disconnected. A control signal indicated as Vc(s) in FIG. 34D and as listed in Table 3 can be provided to the assembly (272) of the four SPST switches (100a, 100b, 100c, 100d) to effectuate such a switching state.

As one can see, other switching configurations can also be implemented with the DPDT switch of FIGS. 34A-34E. It will also be understood that other switches such as 3P3T of FIGS. 32 and 33 can be controlled by control logic in a similar manner.

Examples of Implementations in Products

Figure 35A:
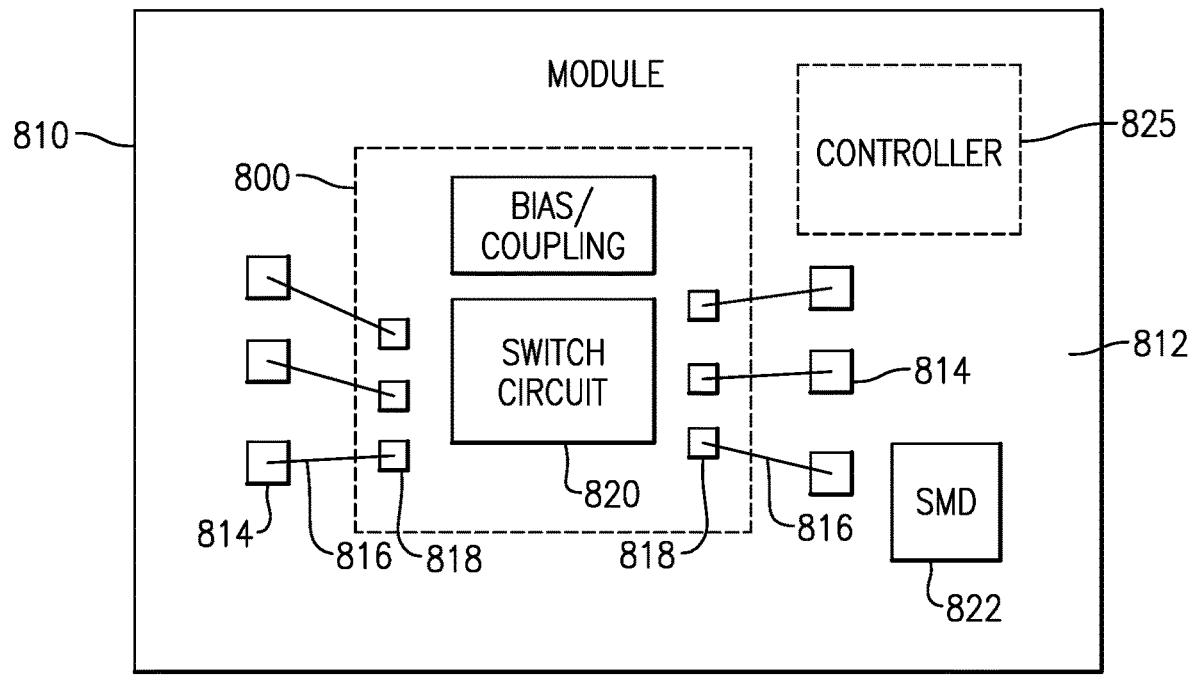
FIGS. 35A and 35B show plan and side views, respectively, of a packaged module having one or more features as described herein.

In some embodiments, one or more die having one or more features described herein can be implemented in a packaged module. An example of such a module is shown in FIGS. 35A (plan view) and 35B (side view). A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having integrated active and passive devices, as described herein, is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 35B:
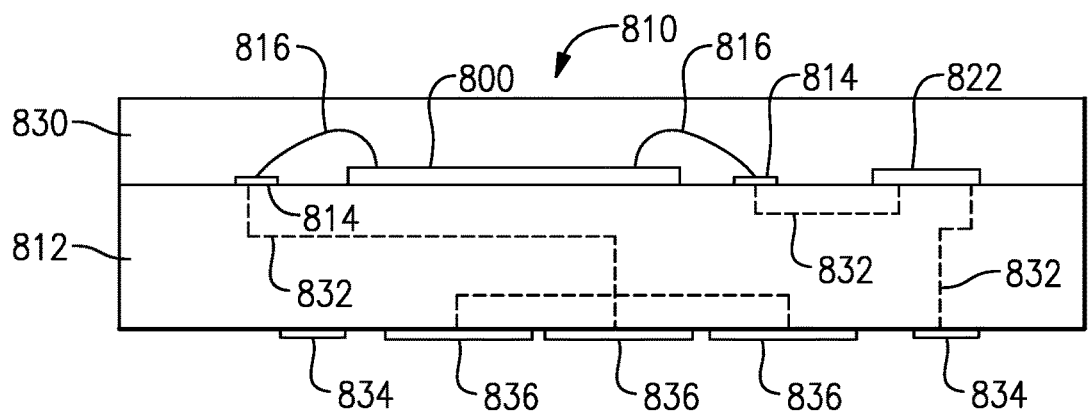
Figure 36:
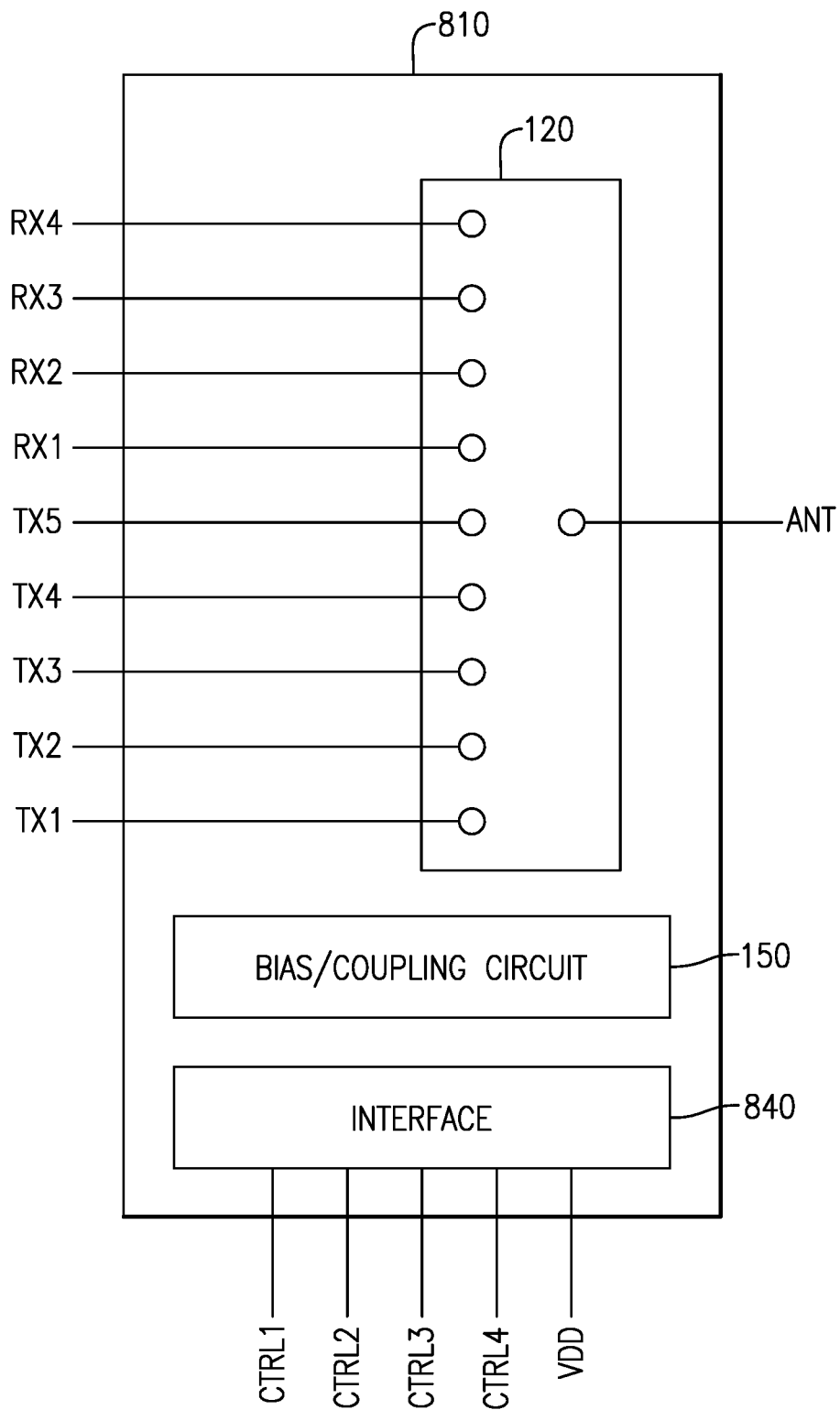
FIG. 36 shows a schematic diagram of an example switching configuration that can be implemented in a module according to one or more embodiments.

FIG. 36 shows a schematic diagram of an example switching configuration that can be implemented in the module 810 described in reference to FIGS. 35A and 35B. Although described in the context of a switch circuit and the bias/coupling circuit being on the same die (e.g., example configuration of FIG. 35A), it will be understood that packaged modules can be based on other configurations. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 37:
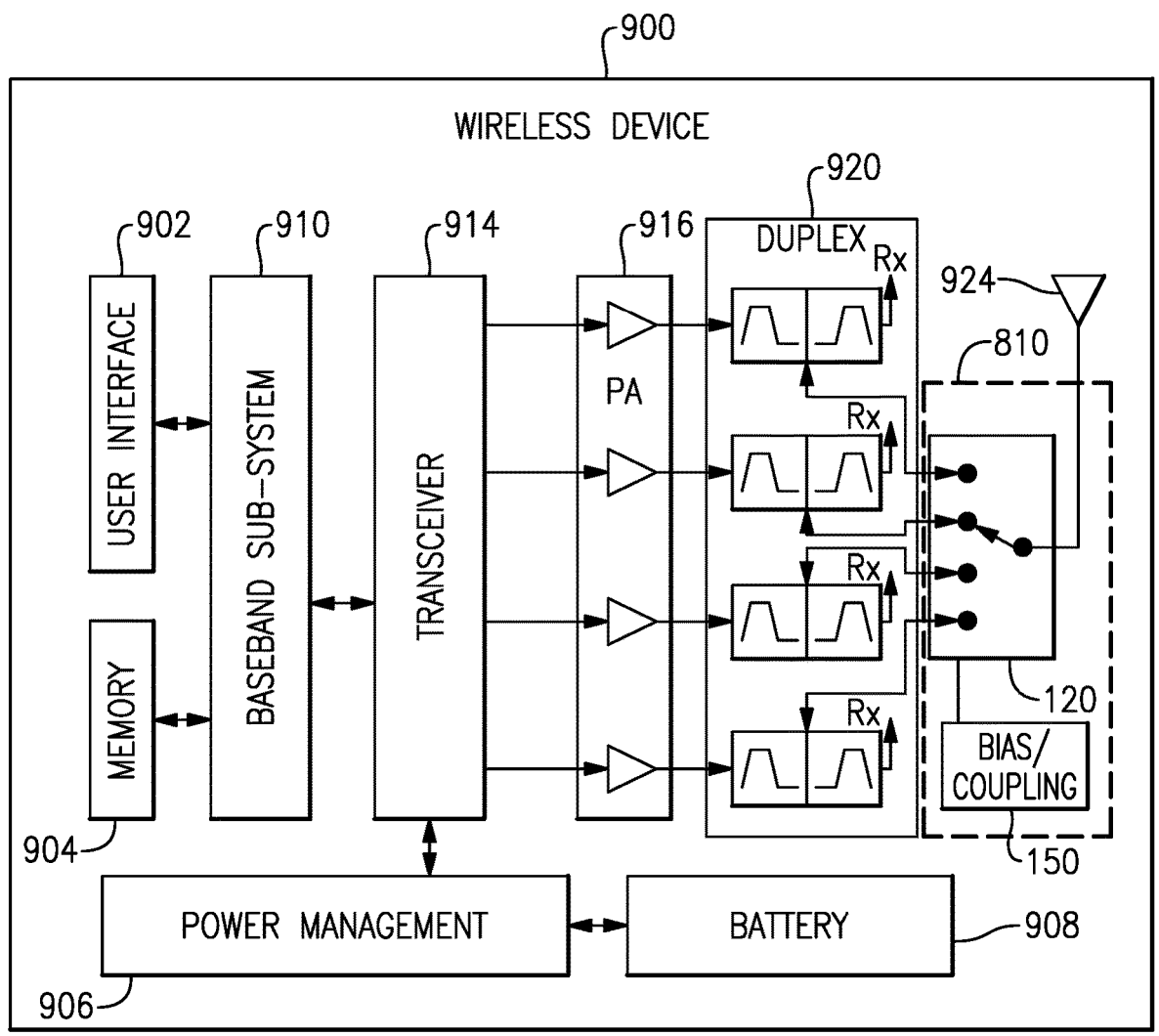
FIG. 37 depicts an example wireless device having one or more advantageous features described herein.

FIG. 37 schematically depicts an example wireless device 900 having one or more advantageous features described herein. In the context of various switches and various biasing/coupling configurations as described herein, a switch 120 and a bias/coupling circuit 150 can be part of a module 919, which may include integrated active and passive devices in accordance with one or more of the IPD processing on SOI layer transfer substrate processes and embodiments disclosed herein. Furthermore, other components of the device 900 may include integrated active/ passive die(s) as described herein, such as the power amplifier module 914, duplexer 920 and/or other components or combinations thereof. In some embodiments, the switch module 919 can facilitate, for example, multi-band multi-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 919.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 37, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency device comprising:
   a first transistor including a first set of fingers arranged in parallel, the first set of finger having a first finger-to-finger spacing;
   a second transistor in a series connection with the first transistor, the second transistor including a second set of fingers arranged in parallel, the second set of fingers having a second finger-to-finger spacing that is greater than the first finger-to-finger spacing; and
   a third transistor in adjacent series connection with the second transistor, the third transistor including a third set of fingers arranged in parallel, the third set of fingers having a third finger-to-finger spacing that is greater than the second finger-to finger spacing.

2. The radio-frequency device of claim 1 wherein the third transistor has a width that is greater than a width of the second transistor.

3. The radio-frequency device of claim 1 wherein the first and second transistors are silicon-on-insulator transistors.

4. The radio-frequency device of claim 1 wherein the first set of fingers are shorter than the second set of fingers.

5. The radio-frequency device of claim 1 wherein the first transistor occupies a smaller physical area than the second transistor.

6. The radio-frequency device of claim 1 wherein at least some of the first set of fingers have metal traces electrically coupled thereto to provide added capacitance.

7. The radio-frequency device of claim 1 wherein the first transistor covers a physical area equal to a physical area covered by the second transistor.

8. A wireless device comprising:
   a transceiver configured to process radio-frequency signals;
   a radio-frequency module in communication with the transceiver, the radio-frequency module including a first transistor including a first plurality of fingers having a first finger-to-finger spacing, a second transistor in a series connection with the first transistor, the second transistor including a second plurality of fingers having a second finger-to-finger spacing that is greater than the first finger-to-finger spacing, and a third transistor in a series connection with the first transistor and the second transistor, the third transistor including a third plurality of fingers having a third finger-to-finger spacing that id greater than the second finger-to-finger spacing; and
   an antenna in communication with the radio-frequency module, the antenna configured to facilitate transmitting and/or receiving of the radio-frequency signals.

9. The wireless device of claim 8 wherein the radio-frequency module is a switch module.

10. The wireless device of claim 8 wherein the third transistor has a width that is greater than a width of the second transistor.

11. The wireless device of claim 8 further comprising a fourth transistor in a series connection with the third transistor, the fourth transistor including a fourth plurality of fingers having a fourth finger-to-finger spacing that is equal to third finger-to-finger spacing.

12. The wireless device of claim 8 wherein the second plurality of fingers are longer than the first plurality of fingers and shorter than the third plurality of fingers.

13. The wireless device of claim 8 wherein the first plurality of fingers consists of more fingers than the second plurality of fingers.

14. The wireless device of claim 8 wherein the first plurality of fingers are shorter than the second plurality of fingers.

15. The wireless device of claim 8 wherein the first transistor has a total periphery that is greater than a total periphery of the second transistor.

16. The wireless device of claim 8 wherein at least some of the first plurality of fingers have metal traces electrically coupled thereto to provide added capacitance.

17. The wireless device of claim 8 wherein the first transistor occupies a smaller physical area than the second transistor.

18. The wireless device of claim 8 wherein the first transistor has a physical area equal to a physical area of the second transistor.

19. A method of fabricating a switch comprising:
   forming a first transistor on a semiconductor substrate, the first transistor having a first finger-to-finger spacing;
   forming a second transistor on the semiconductor substrate in a series connection with the first transistor, the second transistor having a second finger-to-finger spacing that is greater than the first finger-to-finger spacing; and
   forming a third transistor on the semiconductor substrate in a series connection with the second transistor, the third transistor having a third finger-to-finger spacing that is greater than the second finger-to-finger spacing.

20. The method of claim 19 wherein the third transistor has a width that is greater than the second transistor.

21. The method of claim 19 wherein the first transistor has a gate width that is shorter than a gate width of the second transistor.

* * * * *